(12) United States Patent
Murata

(10) Patent No.: US 7,029,946 B2
(45) Date of Patent: Apr. 18, 2006

(54) METHOD FOR MANUFACTURING SEMICONDUCTOR DEVICE AND SEMICONDUCTOR DEVICE

(75) Inventor: Akihiro Murata, Yamanashi-ken (JP)

(73) Assignee: Seiko Epson Corporation, (JP)

( * ) Notice: Subject to any disclaimer, the term of this patent is extended or adjusted under 35 U.S.C. 154(b) by 118 days.

(21) Appl. No.: 10/671,010

(22) Filed: Sep. 25, 2003

(65) Prior Publication Data

US 2004/0137660 A1    Jul. 15, 2004

(30) Foreign Application Priority Data

Jan. 15, 2003    (JP) .............................. 2003-006613

(51) Int. Cl.
*H01L 21/44* (2006.01)
*H01L 21/48* (2006.01)
*H01L 21/50* (2006.01)

(52) U.S. Cl. ...................... 438/106; 438/613; 438/123; 438/612

(58) Field of Classification Search ................ 438/106, 438/123, 611, 613, 612, 110, 108
See application file for complete search history.

(56) References Cited

U.S. PATENT DOCUMENTS

| 6,475,896 B1 * | 11/2002 | Hashimoto .................. 438/613 |
| 6,737,364 B1 * | 5/2004 | Black et al. ................. 438/778 |
| 6,853,433 B1 * | 2/2005 | Kim et al. .................. 349/158 |

FOREIGN PATENT DOCUMENTS

| JP | 2002-057291 | 2/2002 |
| JP | 2002-057292 | 2/2002 |

\* cited by examiner

*Primary Examiner*—Chuong Anh Luu
(74) *Attorney, Agent, or Firm*—Harness, Dickey & Pierce, P.L.C.

(57) ABSTRACT

A method for manufacturing a semiconductor device includes the steps of forming a stress relief layer on a wafer such that the stress relief layer is away from at least part of electrodes formed on the wafer; forming a wiring layer in which lines that extend from the electrodes to the stress relief layer are formed; forming outer electrodes that are over the stress relief layer and are connected to the lines in the wiring layer; and forming a dielectric layer by applying dielectric liquid by an inkjet method to portions in the lines where the outer electrodes are connected to form a capacitor. The step of forming the dielectric layer is conducted after the step of forming the wiring layer.

14 Claims, 13 Drawing Sheets

METHOD FOR MANUFACTURING SEMICONDUCTOR DEVICE AND SEMICONDUCTOR DEVICE

BACKGROUND OF THE INVENTION

1. Field of the Invention

The present invention relates to a method for manufacturing a semiconductor device having a chip scale package (CSP) structure and to a semiconductor device manufactured by the method.

2. Description of the Related Art

Although bare chip mounting is ideal for high-density mounting of a semiconductor device, it is difficult to guarantee the quality of bare chips and to handle them. Consequently, CSPs having a size near to that of a chip have been developed. In recent years, higher-density mounting has been desired because of the need for further reducing the size of electronic equipment, thus technologies in which passive devices that have been mounted around a CSP on a substrate are packaged in the CSP have been developed. Methods for containing capacitors in a CSP include a method for manufacturing a semiconductor device that has a semiconductor substrate having a circuit-element formation area and a plurality of connection pads formed thereon, an insulation film formed on the circuit-element formation area, and a plurality of columnar electrodes connected to the connection pads (for example, Patent Document 1). The method includes a step of forming a first conductive layer on the circuit-element formation area on the semiconductor substrate through the insulating film sandwiched therebetween and a step of forming a dielectric layer on the first conductive layer and forming a second conductive layer on the dielectric layer to form a capacitive element.

Methods for containing inductors in a CSP include a method for manufacturing a semiconductor device that has a semiconductor substrate having a circuit-element formation area and a plurality of connection pads formed thereon, an insulation film formed on the circuit-element formation area, a plurality of first conductive layers that are connected to the connection pads and are provided on the circuit-element formation area through the insulation film sandwiched therebetween, and a plurality of columnar electrodes provided on the first conductive layers (for example, Patent Document 2). The method includes a step of forming at least one second conductive layer over the insulating film and a step of forming an inductive element from the second conductive layer.

Patent Document 1 Japanese Unexamined Patent Application Publication No. 2002-57291

Patent Document 2 Japanese Unexamined Patent Application Publication No. 2002-57292

However, sputtering, photolithography, and electroplating are used for forming passive devices in the known technologies described above, thus disadvantageously having the increased number of required processes and therefore raising its cost.

SUMMARY OF THE INVENTION

Accordingly, it is an object of the present invention to provide a method for manufacturing a semiconductor device, which is capable of achieving a simplified manufacturing process and a reduction in cost, and to provide a semiconductor device manufactured by the method.

The present invention provides, in its first aspect, a method for manufacturing a semiconductor device. The method includes the steps of forming a stress relief layer on a wafer such that the stress relief layer is away from at least part of electrodes formed on the wafer; forming a wiring layer in which lines that extend from the electrodes to the stress relief layer are formed; forming outer electrodes that are over the stress relief layer and are connected to the lines in the wiring layer; and forming a dielectric layer by applying dielectric liquid by an inkjet method to portions in the lines where the outer electrodes are connected to form a capacitor, after the step of forming the wiring layer. With this method, the manufacturing process is simplified, compared with a case in which a dielectric layer is formed with a thin-film formation technology by sputtering and photolithography, thus achieving the improved productivity and the reduction in cost.

The method for manufacturing a semiconductor device of the present invention preferably further includes the steps of forming a protective film on the wiring layer after the step of forming the wiring layer, and forming an opening in at least part of the protective film, corresponding to the outer electrodes, before the step of forming the outer electrodes. Applying the dielectric liquid by the inkjet method to the opening preferably forms the dielectric layer in the step of forming the dielectric layer. With this method, the internal surfaces of the opening serve as guides for receiving the dielectric liquid in the opening. Controlling the number of times the dielectric liquid is discharged with the volume of the opening being set to a predetermined value permits the thickness control with a high precision.

The method for manufacturing a semiconductor device of the present invention preferably includes the step of sintering the dielectric layer after the step of forming the dielectric layer. With this method, the dielectric constant of the dielectric layer is increased and stabilized.

The method for manufacturing a semiconductor device of the present invention may further include the steps of sintering the dielectric layer and forming a conductive layer by applying conductive liquid by the inkjet method to the sintered dielectric layer. The steps of sintering the dielectric layer and of forming the conductive layer are conducted after the step of forming the dielectric layer.

In the step of forming the dielectric layer in the method for manufacturing a semiconductor device of the present invention, controlling the number of times the dielectric liquid is discharged with a discharge head for applying the dielectric liquid by the inkjet method to control the thickness of the dielectric layer preferably forms a capacitor having a desired capacitance. By using the inkjet method described above, the capacitance of the formed capacitor can be easily controlled.

The method for manufacturing a semiconductor device of the present invention preferably further includes the step of forming multiple wiring layers in which stress relief layers and wiring layers are alternately deposited, vertically adjacent wiring layers are electrically connected to each other, and the lines on the top wiring layer are connected to the outer electrodes. The step of forming the multiple wiring layers is conducted after the step of forming the wiring layer. In the step of forming the multiple wiring layers, formation of the dielectric layer between the wiring layers at portions where the vertically adjacent wiring layers are electrically connected to each other or between the top wiring layer and the outer electrodes in the multiple wiring layers preferably forms the capacitor. Even in the semiconductor device having the multiple wiring layers, the capacitor can be formed in the manner described above.

The present invention provides, in its second aspect, a method for manufacturing a semiconductor device including the steps of forming a stress relief layer on a wafer such that the stress relief layer is away from at least part of electrodes formed on the wafer; forming a wiring layer in which lines that extend from the electrodes to the stress relief layer are formed; forming outer electrodes that are over the stress relief layer and are connected to the lines in the wiring layer; and forming on the stress relief layer an inductor that is electrically connected to the lines by applying conductive liquid in a spiral pattern by the inkjet method, after the step of forming the wiring layer. With this method, the manufacturing process is simplified, compared with a case in which an inductor that is a spiral conductive layer is formed with a thin-film formation technology by sputtering, photolithography, and electroplating, thus achieving the improved productivity and the reduction in cost.

The method for manufacturing a semiconductor device of the present invention preferably further includes the steps of forming a protective film on the wiring layer after the step of forming the wiring layer and forming a spiral open pattern corresponding to the inductor on the protective film before the step of forming the inductor. Applying the conductive liquid by the inkjet method to the open pattern preferably forms the inductor in the step of forming the inductor. With this method, the internal surfaces of the opening serve as guides for receiving the conductive liquid in the open pattern. Accordingly, since the precision of the open pattern, that is, the precision of a resist pattern by photolithography determines the wiring width, the inductor can be manufactured with a high precision.

The method for manufacturing a semiconductor device of the present invention preferably includes the step of roughening the surface of the stress relief layer in a spiral pattern before the step of forming the inductor. In the step of forming an inductor, applying the conductive liquid by the inkjet method to the spiral pattern where the surface of the stress relief layer is roughened preferably forms the inductor. With this method, a semiconductor device with a high reliability can be manufactured because the adhesiveness of the conductive liquid to the stress relief layer is improved. The step of roughening the surface of the stress relief layer may be conducted by laser abrasion or sandblasting.

In the step of forming the inductor in the method for manufacturing a semiconductor device of the present invention, controlling the number of times the conductive liquid is discharged with a discharge head for applying the conductive liquid by the inkjet method to control the thickness of the conductive layer preferably forms the inductor having a desired resistance. By using the inkjet method described above, the resistance of the formed inductor can be easily controlled.

In the step of forming the inductor in the method for manufacturing a semiconductor device of the present invention, controlling the behavior of the discharge head for applying the conductive liquid by the inkjet method to control the number of turns in the spiral pattern preferably forms the inductor having a desired inductance. By using the inkjet method described above, the inductance of the formed inductor can be easily controlled.

The method for manufacturing a semiconductor device of the present invention preferably further includes the step of forming multiple wiring layers in which stress relief layers and wiring layers are alternately deposited, vertically adjacent wiring layers are electrically connected to each other, and the lines on the top wiring layer are connected to the outer electrodes. The step of forming the multiple wiring layers is conducted after the step of forming the wiring layer. In the step of forming the multiple wiring layers, applying the conductive liquid in the spiral pattern by the inkjet method preferably forms at least one wiring layer in the multiple wiring layers to form the inductor. Even in the semiconductor device having the multiple wiring layers, the inductor can be formed in the manner described above.

The present invention provides, in its third aspect, a method for manufacturing a semiconductor device including the steps of forming a stress relief layer on a wafer such that the stress relief layer is away from at least part of electrodes formed on the wafer; forming a wiring layer in which lines that extend from the electrodes to the stress relief layer are formed; forming outer electrodes that are over the stress relief layer and are connected to the lines in the wiring layer; and forming multiple wiring layers in which stress relief layers and wiring layers are alternately deposited, vertically adjacent wiring layers are electrically connected to each other, and the lines on the top wiring layer are connected to the outer electrodes, after the step of forming the wiring layer. The step of forming the multiple wiring layers includes the step of forming a filter having at least one capacitor that has a dielectric layer between the wiring layers at the portions where the vertically adjacent wiring layers are electrically connected to each other or between the top wiring layer and the outer electrodes and at least one inductor that is at least one wiring layer formed in a spiral pattern in the multiple wiring layers. In the step of forming the filter, applying dielectric liquid by the inkjet method forms the dielectric layer and applying conductive liquid in the spiral pattern by the inkjet method forms the inductor. With this method, the filter having at least one capacitor and at least one inductor can be formed in a simplified manufacturing process, compared with a case in which the filter is formed with a thin-film formation technology by sputtering and photolithography, thus achieving the improved productivity and the reduction in cost.

The present invention provides, in its fourth aspect, a method for manufacturing a semiconductor device including the steps of forming a stress relief layer on a wafer such that the stress relief layer is away from at least part of electrodes formed on the wafer; forming a wiring layer in which lines that extend from the electrodes to the stress relief layer are formed; forming outer electrodes that are over the stress relief layer and are connected to the lines in the wiring layer; and forming multiple wiring layers in which stress relief layers and wiring layers are alternately deposited, vertically adjacent wiring layers are electrically connected to each other, and the lines on the top wiring layer are connected to the outer electrodes, after the step of forming the wiring layer. In the step of forming the multiple wiring layers, the wiring layer on one face of the top stress relief layer is formed to be a ground plane such that lines having a microstrip line structure are formed in the wiring layer on the other face of the top stress relief layer. The step of forming the multiple wiring layers includes the step of forming a plurality of strip lines that are electromagnetically coupled to each other and are spaced at predetermined intervals by applying conductive liquid by the inkjet method to the lines having the microstrip line structure to form a bandpass filter. With this method, the use of the inkjet method for forming the lines having the microstrip line structure, the impedance of which is easily controlled, allows the lines to be formed in a smaller number of processes, compared with a case in which lines are formed with a thin-film formation technology by sputtering and photolithography. As a result, the bandpass filter including the lines having the microstrip line structure can be formed in a small number of processes, thus achieving the improved productivity and the reduction in cost.

The present invention provides, in its fifth aspect, a semiconductor device manufactured by any of the methods described above.

DESCRIPTION OF THE PREFERRED EMBODIMENTS

Prerequisite technologies to the present invention will now be described before preferred embodiments of the present invention are described.

Prerequisite Technologies

Figure 4:
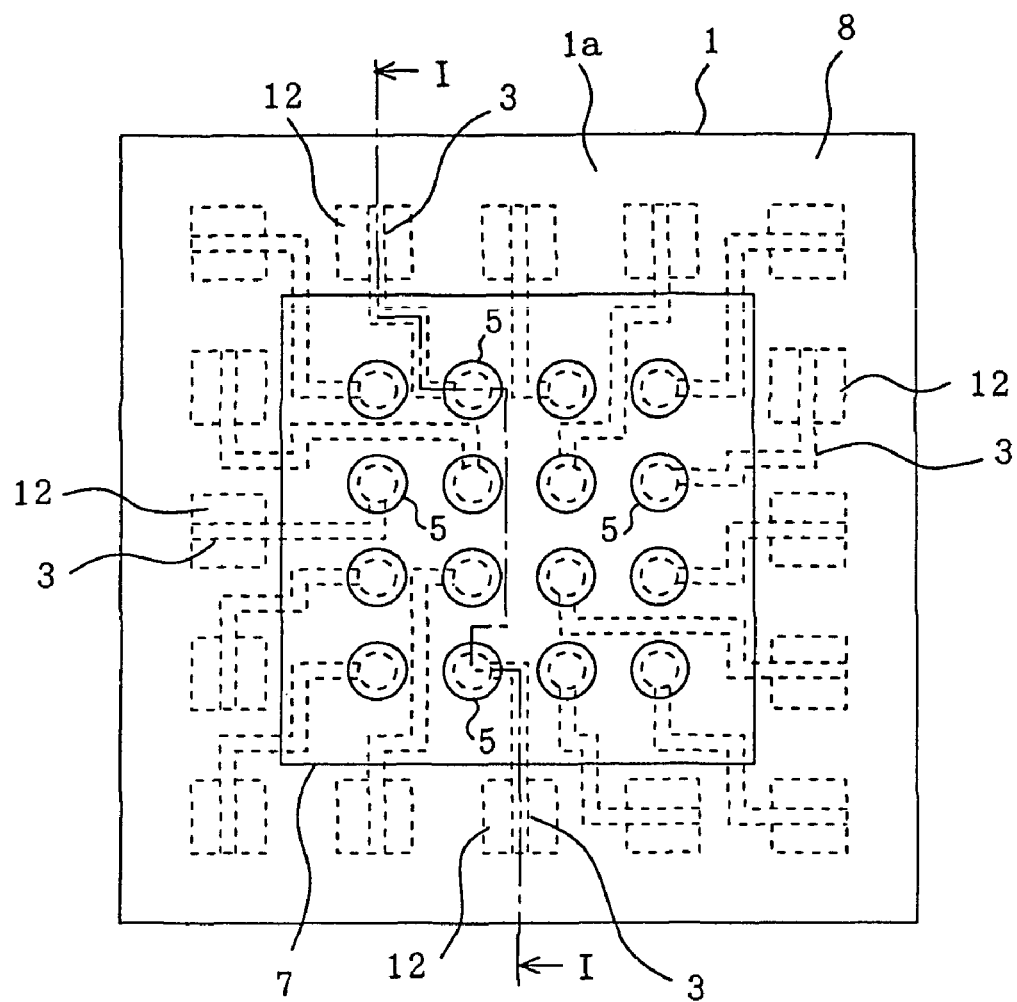
FIG. 4 is a plan view showing the semiconductor device that the present invention presupposes.
Figure 5A:
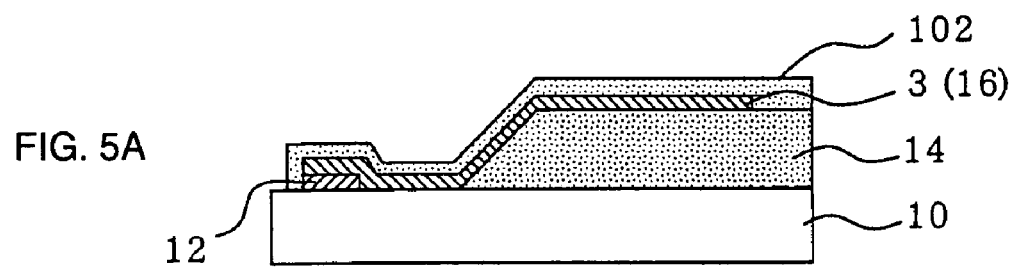
FIG. 5 illustrates a method for manufacturing a semiconductor device according to a first embodiment of the present invention.
Figure 5B:
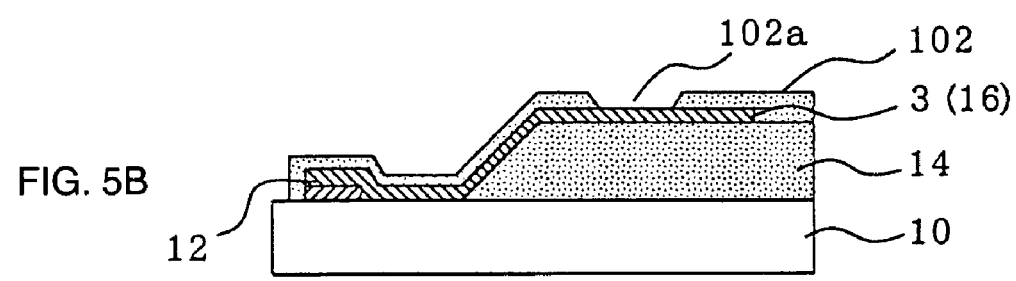
Figure 5C:
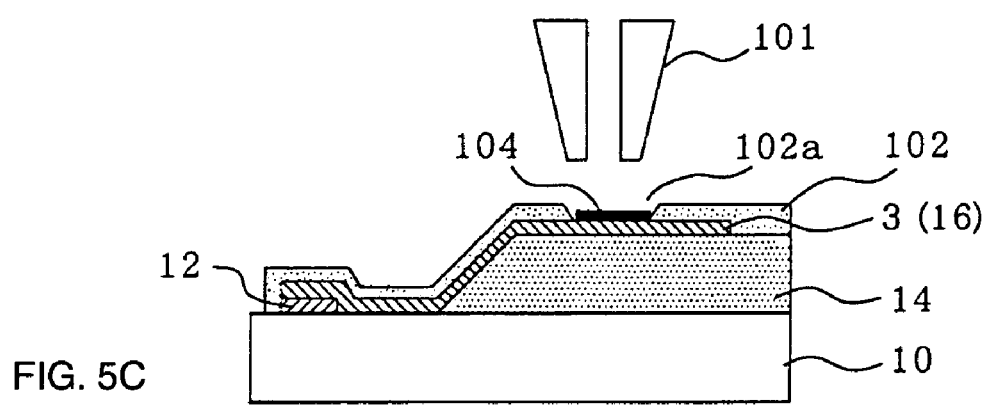
Figure 5D:
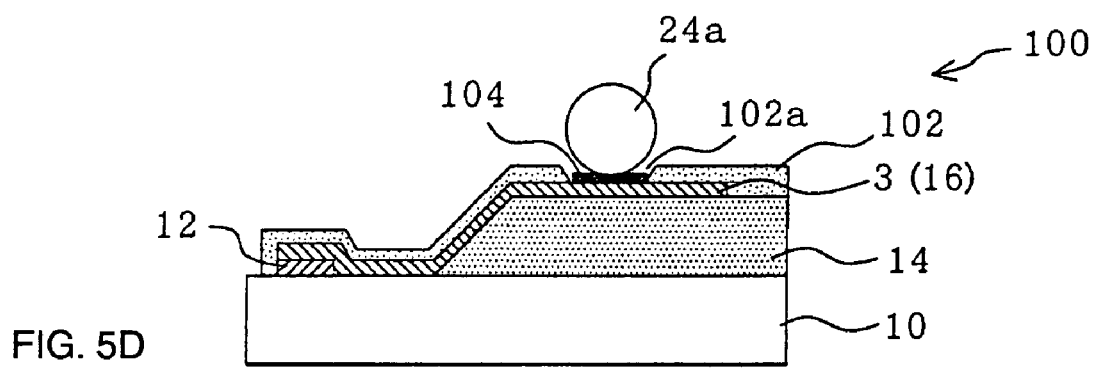

FIG. 4 is a plan view showing a semiconductor device that the present invention presupposes. On this semiconductor device that is classified into a CSP, lines 3 extend from electrodes 12, which are formed along the edges of a semiconductor chip 1, toward the center of an active plane 1a on which active devices are formed. Outer electrodes 5 are connected to the corresponding lines 3. All the outer electrodes 5 are provided on a stress relief layer 7 that relieves the stress generated between the outer electrodes 5 and a circuit board (not shown) when the semiconductor chip is mounted on the circuit board. A solder-resist layer 8 serving as a protective film is formed on areas excluding the outer electrodes 5.

Although the electrodes 12 are shown in about the same size as the outer electrodes 5 in FIG. 1, the electrodes 12 are actually much smaller than the outer electrodes 5. Since the electrodes 12 are arranged along the edges of the semiconductor chip 1, there is a limit to the reduction in spacing between the electrodes 12 or the increase in the number of the electrodes 12 owing to a decrease in size of the semiconductor chip 1. However, providing the stress relief layer 7 in an active area and leading the lines 3 into the active area allows the outer electrodes 5 to be arranged at any place within the active area. Accordingly, the active area, that is, a predetermined plane can be provided for arranging the outer electrodes 5, thus greatly increasing the flexibility of mounting positions. The outer electrodes 5 can be freely arranged in accordance with the positions of the electrodes 12 on the circuit board. For example, the outer electrodes 5 can be arranged in a matrix form, as shown in FIG. 4.

The outer electrodes 5 in FIG. 4 are arranged in the matrix form by bending the lines 3 on the stress relief layer 7. However, this arrangement is not an essential structure of the present invention and the outer electrodes 5 may not necessarily be arranged in a matrix form. Although the width of the electrodes 12 is larger than that of the lines 3 in the joints of the electrodes 12 and the lines 3 in FIG. 4, the width of the lines 3 is preferably equal to or larger than that of the electrodes 12. In particular, when the width of the lines 3 is larger than that of the electrodes 12, the lines 3 are not only reduced in resistance but also increased in strength, thereby preventing disconnection.

Figure 1A:
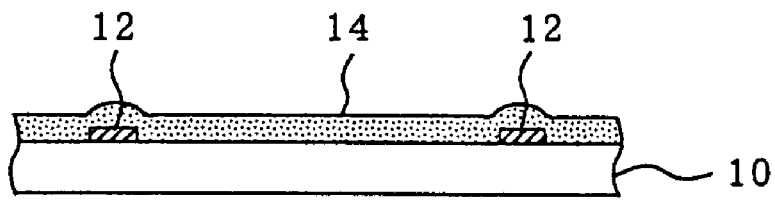
FIG. 1 illustrates a method for manufacturing a semiconductor device that the present invention presupposes.
Figure 1B:
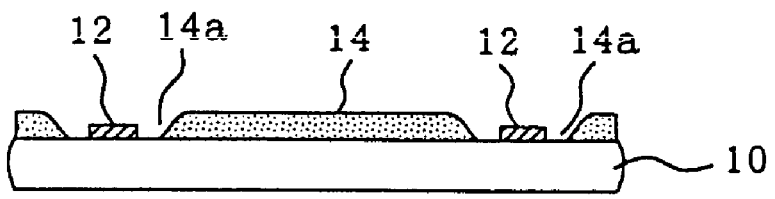
Figure 1C:
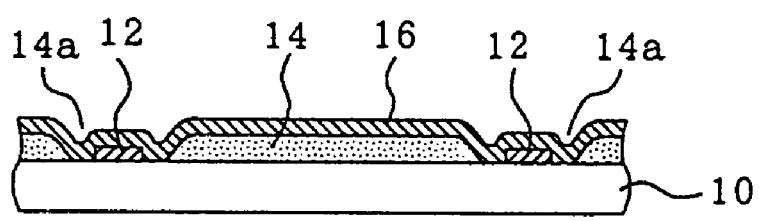
Figure 1D:
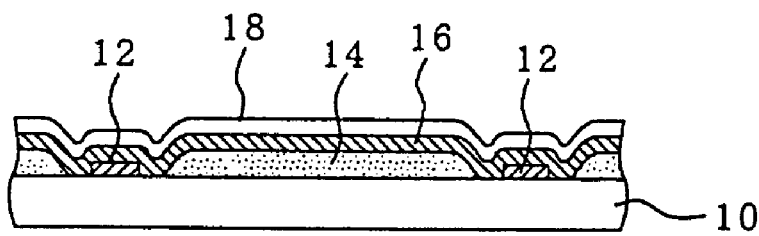
Figure 1E:
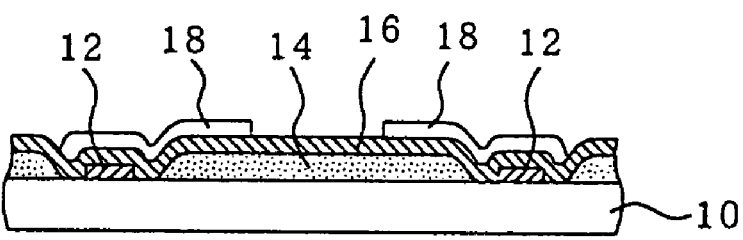
Figures 2A, 2B, 2C, 2D, 2E, 2F, 2G:
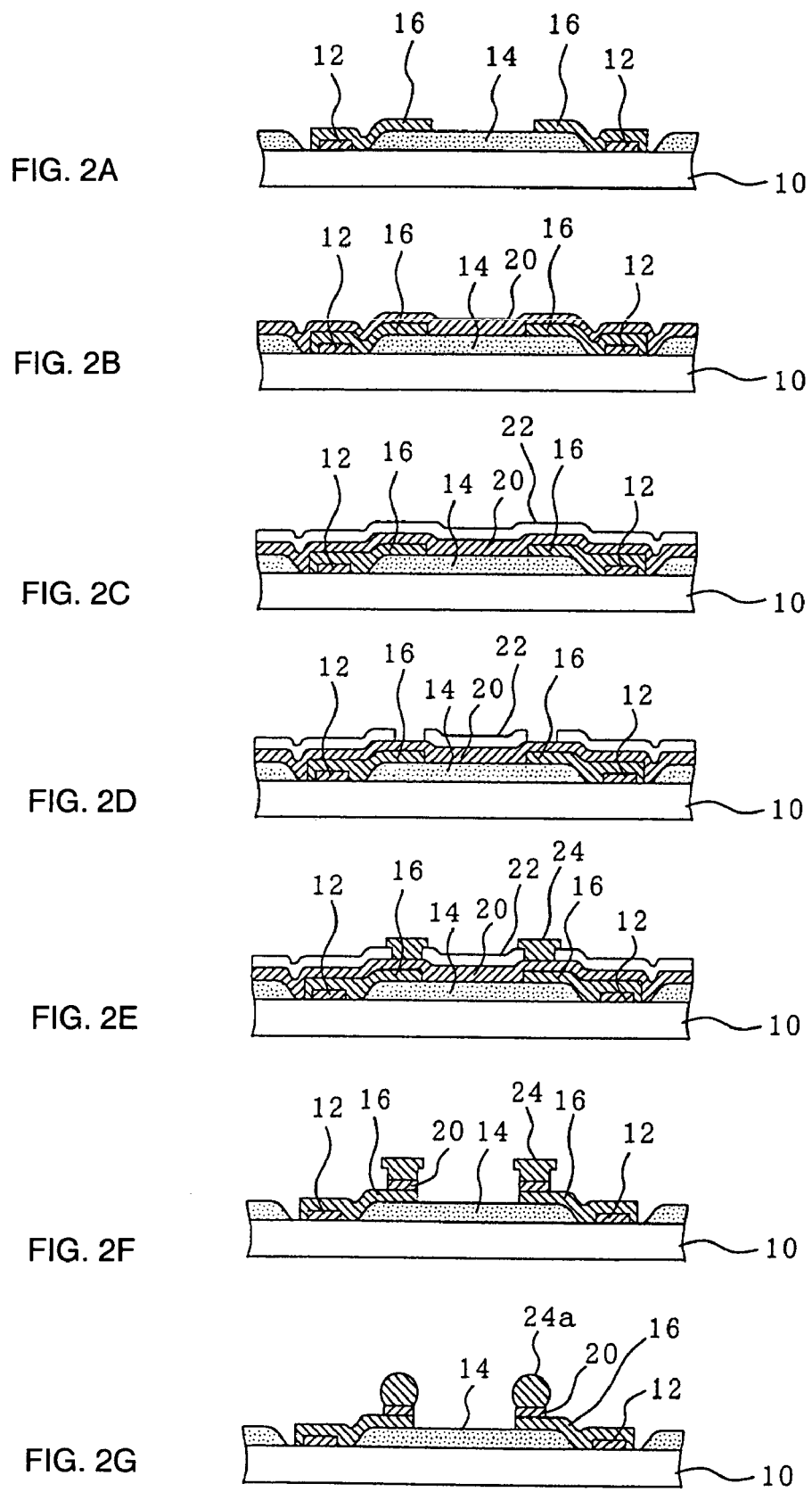
FIG. 2 illustrates the method for manufacturing the semiconductor device that the present invention presupposes.
Figure 3A:
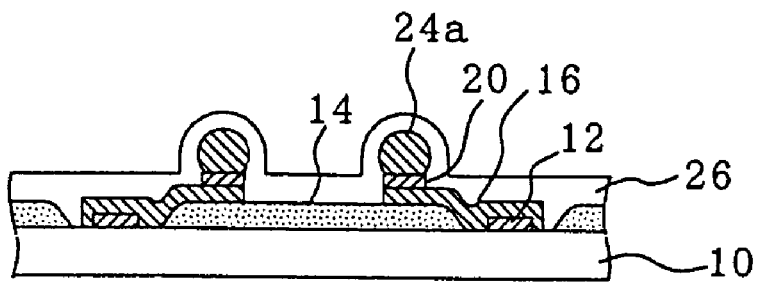
FIG. 3 illustrates the method for manufacturing the semiconductor device that the present invention presupposes.
Figure 3B:
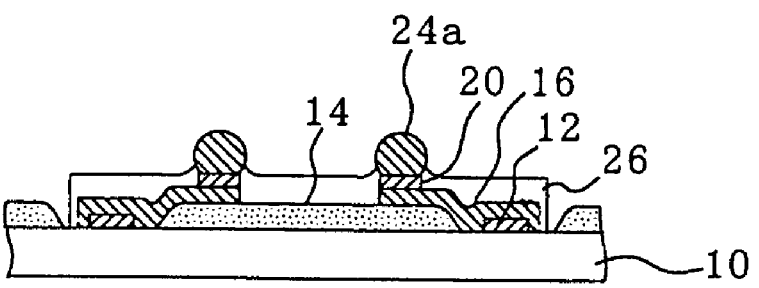
Figure 3C:
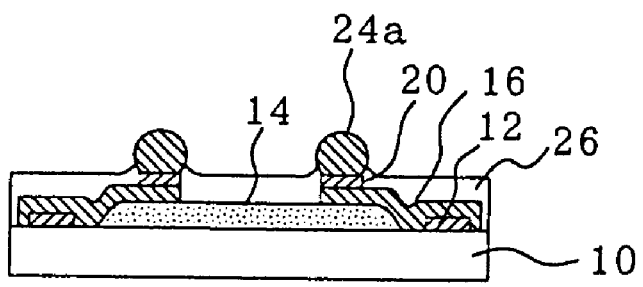

FIGS. 1 to 3 illustrate a method for manufacturing the semiconductor device that the present invention presupposes. FIGS. 1 to 3 correspond to cross-sectional views taken on line I—I in FIG. 4. The semiconductor device in FIGS. 1 to 3 has the stress relief layer provided along the edges of the semiconductor device in FIG. 4. FIGS. 1 to 3 are enlarged views partially showing a wafer and they each show an area corresponding to one semiconductor device.

First, the electrodes 12 and other elements are generally formed on the wafer 10 by a known art to be ready for dicing. Although the electrodes 12 are made of aluminum in this description, they may be made of an aluminum-alloy-based material (for example, aluminum silicon or aluminum silicon copper) or a copper-based material.

A passivation film (not shown) that is, for example, oxide film for preventing chemical change is formed on the surface of the wafer 10. The passivation film is formed so as to bypass not only the electrodes 12 but also scribe lines along which dicing is performed. The formation of the passivation film so as to bypass the scribe lines prevents dusts caused by the passivation film upon dicing from being generated and also prevents cracks in the passivation film from being caused.

Referring to (A) of FIG. 1, a first insulating layer 14 made of photosensitive polyimide resin is formed on the wafer 10 having the electrodes 12. The first insulating layer 14 is formed by applying photosensitive polyimide resin to the wafer 10. The first insulating layer 14 is preferably 1 to 100 µm in thickness and is further preferably around 10 µm in thickness. Since a lot of polyimide resin is wasted by spin coating, an apparatus that zonally discharges polyimide resin by using a pump may be used. Such apparatuses include a FAS ultra-precision extrusion coating system manufactured by FAS Technologies, LTD (U.S. Pat. No. 4,696,885).

Referring to (B) of FIG. 1, contact holes 14a corresponding to electrodes 12 are formed in the first insulating layer 14. Specifically, the removal of polyimide resin around the electrodes 12 by exposure, development, and firing forms the contact holes 14a in the first insulating layer 14. There is no area left where the first insulating layer 14 is in contact with the electrodes 12 when the contact holes 14a are formed in (B) of FIG. 1. Although this structure has an advantage of good electrical contact with metal, such as the lines 3, formed in the subsequent processes, it is not essential. In other words, if the contact holes 14a are formed so as to partially expose the electrodes 12 even when the peripheries of the electrodes 12 are covered with the first insulating layer 14, the objective of the contact holes 14a is sufficiently accomplished. In this case, the number of bends of the lines 3 decreases, thus preventing the decrease in reliability of the lines 3 due to disconnection or the like.

Since the contact holes 14a are tapered in (B) of FIG. 1, the first insulating layer 14 is also sloped down at ends thereof where the contact holes 14a are formed. Such a shape of the first insulating layer 14 is achieved by controlling the conditions of exposure and development. Oxygen-plasma treatment of the surface of the electrodes 12 can perfectly remove the polyimide resin even when some amount of the polyimide resin is left on the electrodes 12. The first insulating layer 14 formed in the manner described above serves as a stress relief layer in the finished semiconductor device.

Although the first insulating layer 14 is made of photosensitive polyimide resin in the above description, the first insulating layer 14 may be made of non-photosensitive resin. For example, material that has a small Young's modulus ($1\times10^{10}$ Pa or less) in solid and has the stress-relief function, such as silicone-modified polyimide resin, epoxy resin, or silicone-modified epoxy resin, may be used.

Referring to (C) of FIG. 1, a chromium (Cr) layer 16 that is a wiring layer is formed over the wafer 10 by sputtering. The lines 3 (refer to FIG. 4) are finally formed in the chromium (Cr) layer 16. The chromium (Cr) layer 16 is formed over the electrodes 12 and the first insulating layer 14. The material of the chromium (Cr) layer 16 is selected because of good adhesiveness of chromium to the first insulating layer 14 made of polyimide resin. In view of crack resistance, aluminum, aluminum alloy or copper alloy such as aluminum silicon or aluminum copper, or spreading metal such as copper (Cu) or gold may be used instead of chromium. Alternatively, the selection of moisture-resistant titanium can prevent disconnection owing to corrosion. Titanium is preferable in view of the adhesiveness to polyimide and titanium tungsten may be used.

In view of the adhesiveness to the chromium (Cr) layer 16, the surface of the first insulating layer 14 made of polyimide or the like is preferably roughened. For example, the surface of the first insulating layer 14 can be roughened by dry processing in which the surface is exposed to plasma ($O_2$, $CF_4$) or by wet processing by using acid or alkali.

Since the ends of the first insulating layer 14 tilt in the contact holes 14a, the chromium (Cr) layer 16 is also formed so as to tilt in these areas. The lines 3 (refer to FIG. 4) are formed in the chromium (Cr) layer 16 in the finished semiconductor device. The chromium (Cr) layer 16 serves as an anti-scattering layer against polyimide resin when a layer is subsequently formed during manufacturing. The material of an anti-scattering layer is not limited to chromium and the anti-scattering layer may be effectively made of any material described above.

Referring to (D) of FIG. 1, applying photoresist to the chromium (Cr) layer 16 forms a first resist layer 18.

Referring to (E) of FIG. 1, the first resist layer 18 is partially removed by exposure, development, and firing. The remaining first resist layer 18 is provided over the electrodes 12 and over part of the first insulating layer 14 excluding the central parts thereof. Namely, the remaining first resist layer 18 is formed over the first insulating layer 14 such that the part of the first resist layer 18 over one electrode 12 is not continuous with (is separated from) the parts of the first resist layer 18 over other electrodes 12.

Etching is applied to the chromium (Cr) layer 16 excluding the areas that are covered with the first resist layer 18 in (E) of FIG. 1. Namely, etching is applied to the chromium (Cr) layer 16 by using the first resist layer 18 as a mask to remove the first resist layer 18. A thin-metal-film formation technology in a wafer process has been applied to this preprocessing. The chromium (Cr) layer 16 to which the etching has been applied is shown in (A) of FIG. 2.

Referring to (A) of FIG. 2, the chromium (Cr) layer 16 is formed over the electrodes 12 and over part of the first insulating layer 14 excluding the central parts thereof. Namely, the chromium (Cr) layer 16 is formed such that the part on one electrode 12 is not continuous with the parts on other electrodes 12. In other words, the chromium (Cr) layer 16 is formed such that the lines 3 corresponding to the electrodes 12 can be arranged.

Referring to (B) of FIG. 2, a copper (Cu) layer 20 serving as a conductive layer is formed by sputtering on the top layer that includes at least the chromium (Cr) layer 16. The copper (Cu) layer 20 is a barrier-metal layer serving as a joint layer for improving the adhesiveness to the outer electrodes 5. The copper (Cu) layer 20 may be a layer made of nickel (Ni).

Referring to (C) of FIG. 2, a second resist layer 22 is formed on the copper (Cu) layer 20. Next, referring to (D) of FIG. 2, the second resist layer 22 is partially removed by exposure, development, and firing. As a result, at least part of the second resist layer 22 over the first insulating layer 14 and over the chromium (Cr) layer 16 is removed.

Referring to (E) of FIG. 2, thick solder 24 from which solder balls 24a serving as the outer electrodes 5 (refer to FIG. 4) are formed is applied to the areas where the second resist layer 22 is partially removed. The thickness of the solder 24 depends on the amount of solder corresponding to the ball size required in the subsequent formation of the solder balls 24a. The solder 24 is applied by electroplating or printing.

Referring to (F) of FIG. 2, the second resist layer 22 in (E) of FIG. 2 is removed and etching is applied to the copper (Cu) layer 20. Next, referring to (G) of FIG. 2, the solder 24 is transformed into hemispherical balls by heat treatment (by using a wetback boiler) to form the solder balls 24a serving as the outer electrodes 5 (refer to FIG. 4).

Processing for prevention of the oxidation of the chromium (Cr) layer 16, improvement in moisture resistance of the finished semiconductor device, mechanical protection of the surface of the semiconductor device, and so on, is performed, as shown in (A) and (B) of FIG. 3.

Referring to (A) of FIG. 3, photosensitive solder is applied to the overall wafer 10 to form a solder-resist layer 26. Next, referring to (B) of FIG. 3, the solder-resist layer 26 is partially removed by exposure, development, and firing in areas where the solder-resist layer 26 is covered with the solder balls 24a and in areas adjacent to the solder balls 24a.

The remaining solder-resist layer 26 serves as an antioxidant film, a protective film in the finished semiconductor device, and a protective film for improving the moisture-proof performance. The electrical characteristic is inspected here and product numbers and/or the manufacturer's name are printed on the semiconductor device if required.

Next, referring to (C) of FIG. 3, the wafer 10 is cut out into individual semiconductor devices by dicing. As seen from the comparison between (B) and (C) of FIG. 3, the wafer 10 is cut out at positions where the first insulating layer 14 is not left. The dicing performed only for the wafer 10 can avoid the problem which occurs when cutting out the multiple layers made of different materials. The dicing is performed in an ordinary manner.

The first insulating layer 14 serves as the stress relief layer 7 (refer to FIG. 4) in the semiconductor device manufactured in the above manner, so that the stress caused by the difference in thermal expansion coefficient between the circuit board (not shown) and the semiconductor chip 1 (refer to FIG. 4) is relieved.

In the method for manufacturing the semiconductor device described above, almost all the processes are completed in a wafer process. In other words, a process of forming external terminals that connect to a mounting board can be performed in the wafer process, thus eliminating the need for conventional packaging processes, that is, an inner lead-bonding process, a process of forming external terminals, and so on that are performed for every semiconductor chip. A substrate such as a patterned film is not necessary for forming the stress relief layer 7. Hence, low-cost and high-quality semiconductor devices can be achieved.

Although the stress relief layer 7 made of photosensitive polyimide resin is used in this example, the stress relief layer 7 may be made of non-photosensitive resin. Two or more chromium (Cr) layers 16 may be formed in this example. Multiple layers generally increase the overall thickness, thus permitting the reduction in interconnect resistance. In particular, when one layer is made of chromium (Cr), a multilayer structure can reduce the interconnect resistance because copper (Cu) or gold has smaller electrical resistance than chromium (Cr). Alternatively, a titanium layer may be formed on the stress relief layer 7 and a layer made of nickel, or platinum and gold may be formed on the titanium layer. Two layers made of platinum and gold may be used for wiring.

Embodiments of the present invention will now be described based on the prerequisite technologies described above. Drawings that are hereinafter referred to are partially enlarged views. In particular, since one finished semiconductor chip is assumed in the following description, some of the terms or shapes that are used in the following description are slightly different from those that are actually used. Parts that are referred to as semiconductor chips literally indicate semiconductor chips and also indicate wafers that have not been cut out into semiconductor chips according to the situation. In other words, the semiconductor chips here should have predetermined circuits that can be separately used, which are formed on a base substrate made of, for example, silicon. There is no need for restricting its meaning to semiconductor chips or an integrated semiconductor device. Since only typical parts that are necessary for the description of wiring and the like are indicated in the drawings, similar parts or other structures are omitted from the drawings.

Methods for manufacturing semiconductor devices, according to the embodiments of the present invention, may be applied to a wafer before dicing or individual semiconductor devices produced after the wafer is cut out by dicing.

First Embodiment

A capacitor is formed on a semiconductor device having the CSP structure described in the prerequisite technologies in a first embodiment or a second embodiment described below.

FIG. 5 is a diagram illustrating a method for manufacturing a semiconductor device, according to the first embodiment. In the first embodiment, the processes shown in (A) to (E) of FIG. 1 and (A) of FIG. 2 are conducted in the same manner as in the prerequisite technologies. Hence, the detailed description of the processes that are the same in the prerequisite technologies will be omitted. The following description focuses on the difference between the first embodiment and the prerequisite technologies in the subsequent processes.

Referring to (A) of FIG. 5, after the lines 3 are formed in the chromium (Cr) layer 16, a second insulating layer 102 made of photosensitive polyimide resin is formed over the wafer 10. The second insulating layer 102 is formed by applying photosensitive polyimide resin to the wafer 10. Referring to (B) of FIG. 5, an opening 102a is formed in part of the second insulating layer 102, under which the first insulating layer 14 serving as the stress relief layer exists, to expose part of the lines 3. Specifically, partially removing the second insulating layer 102 by exposure, development, and firing in a photolithography process at a portion under which the first insulating layer 14 exists forms the opening 102a in the second insulating layer 102 in order to expose the lines 3 at the bottom of the opening 102a.

Referring to (C) of FIG. 5, dielectric liquid is applied by an inkjet method to the lines 3 exposed at the opening 102a to form a dielectric layer 104. Specifically, the dielectric liquid is applied to the lines 3 by using a discharge head 101 used in an inkjet printer or the like to form the dielectric layer 104. The dielectric liquid is preferably high-dielectric-constant material having a relative dielectric constant of, for example, four or more. Namely, for example, dielectric material such as liquid crystal polymer, dielectric mixture having barium titanate filler mixed with organic solvent, or dielectric mixture having lithium niobate filler mixed with organic solvent may be used.

Sintering the dielectric layer 104 improves a dielectric constant of the dielectric layer 104 and also stabilizes the dielectric constant. Referring to (D) of FIG. 5, the solder ball 24a serving as the outer electrode 5, as described in the prerequisite technologies, is formed on the sintered dielectric layer 104. After the solder ball 24a is formed, the wafer 10 is cut out into individual semiconductor devices 100 by dicing, as described in the prerequisite technologies. The semiconductor device 100 according to the first embodiment is manufactured in the above manner.

Although the copper (Cu) layer 20 in FIG. 2 is omitted in FIG. 5, the copper (Cu) layer 20 may be formed in the manner described above or may not be formed. In both cases, the solder ball 24a serving as the outer electrode 5 should be formed on the dielectric layer 104. Since the second insulating layer 102 is provided over the wafer 10 in the first embodiment, the process of forming the solder-resist layer 26 that is a protective film after the solder ball 24a is formed may be omitted because the second insulating layer 102 has the same function as the solder-resist layer 26 in the prerequisite technologies. Alternatively, the solder-resist layer 26 that is a protective film may be formed over the wafer 10 in (D) of FIG. 5 to provide double protective films.

A capacitor in which the lines 3 beneath the dielectric layer 104 and the solder ball 24a on the dielectric layer 104 serve as electrodes between which the dielectric layer 104 is sandwiched is formed in the manner described above. When a conductive layer is formed on the dielectric layer 104, the conductive layer serves as an electrode. The discharge head 101 for discharging ink in an inkjet method may be any head that can discharge a predetermined amount of liquid for every extrusion. Various types of discharge heads, such as piezoelectric-driven-type discharge head, electrostatic-type discharge head, or bubblejet (registered trademark) discharge head, can be used.

The opening 102a is formed in the second insulating layer 102 that is formed on the chromium (Cr) layer 16 serving as a wiring layer and the dielectric layer 104 is formed by applying the dielectric liquid to the opening 102a in the first embodiment. However, the dielectric layer 104 may be formed by directly applying dielectric liquid to portions where the outer electrodes 5 are connected to the lines 3 without forming the second insulating layer 102 and the opening 102a.

According to the first embodiment, since the inkjet method is used for forming the dielectric layer 104 constituting a capacitor, the manufacturing process is simplified, compared with conventional technologies that form a dielectric layer by photolithography and sputtering. Specifically, in conventional technologies, desired openings are formed in the formed second insulating layer 102 by photolithography and then the dielectric layer 104 is formed by depositing dielectric material by sputtering. In contrast, in the film formation technology by using the inkjet method of the present invention, only applying dielectric material to target areas can form the dielectric layer 104. The manufacturing process can be simplified in the first embodiment, thus increasing its productivity and achieving the reduction in cost of manufacture.

Since dielectric liquid can be applied only to areas that require the application in the inkjet method, the amount of used material can be reduced, compared with methods that use sputtering and photolithography to form a dielectric layer, thus achieving the reduction in cost of manufacture in this aspect.

Figure 6:
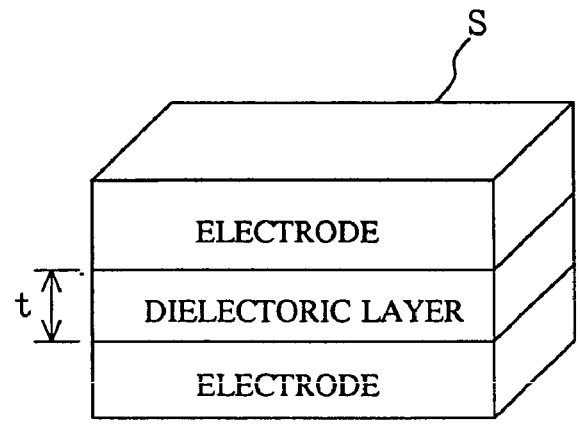
FIG. 6 is a diagram showing the structure of a capacitor.

Since the required amount of dielectric liquid can be applied by controlling the number of times the dielectric liquid is discharged with the discharge head 101 in the inkjet method, the thickness of the dielectric layer 104 can be easily controlled, compared with film formation process by sputtering. Equation (1) is given, where t represents the thickness of a dielectric layer, $\in_r$ represents the relative dielectric constant of dielectric material, $\in_0$ represents the dielectric constant in vacuum, S represents the area of an electrode, and C represents the capacitance, as shown in FIG. 6.

$$C=\in_r \cdot \in_0 \cdot S/t \qquad (1)$$

Easy control of the thickness of the dielectric layer, as described above, permits easy control of the capacitance C. Accordingly, controlling the number of times the dielectric liquid is discharged to control the thickness of the dielectric layer 104 allows a capacitor having a desired capacitance to be easily formed.

Dielectric liquid is applied to the opening 102a in the first embodiment, so that the internal surfaces of the opening 102a serve as guides for receiving the dielectric liquid in the opening 102a. Accordingly, setting the volume of the opening 102a to a predetermined value and controlling the number of times the dielectric liquid is discharged permit control of the thickness with high precision.

Since the internal surfaces of the opening 102a tilt outward, the dielectric liquid easily flows into the opening 102a and therefore the applied dielectric liquid is surely received in the opening 102a. The internal surfaces of the opening 102a are not limited to the outward tilt and they may be formed perpendicular to the bottom of the opening 102a. In such a case, the thickness can be further easily controlled although the above advantages are slightly reduced.

Different amount of dielectric liquid can be applied to different portions on the wafer 10 in the inkjet method, so that varying the amount of applied dielectric liquid for every semiconductor chip can form capacitors having different capacitances for every semiconductor chip.

In the inkjet method, providing a plurality of tanks for storing different kinds of dielectric liquid in different tanks allows different kinds of dielectric liquid to be applied for every semiconductor chip.

Second Embodiment

Figure 7A:
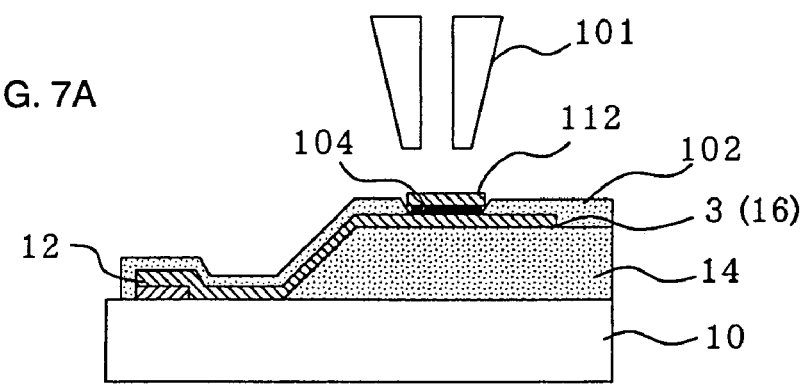
FIG. 7 illustrates a method for manufacturing a semiconductor device according to a second embodiment of the present invention.
Figure 7B:
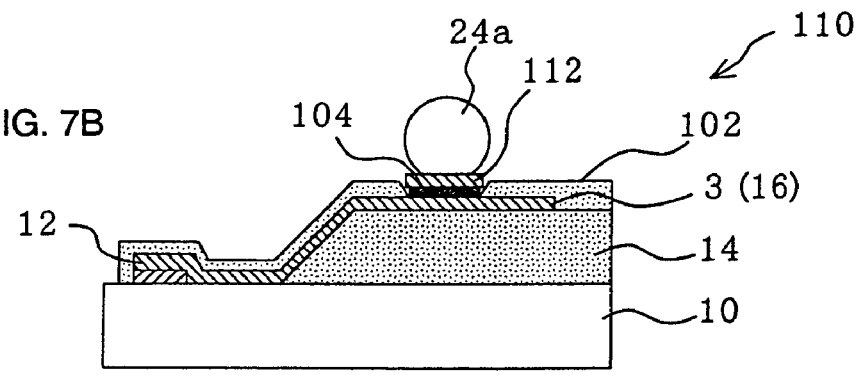

FIGS. 7 is a diagram illustrating a method for manufacturing a semiconductor device, according to a second embodiment. In the second embodiment, the processes (A) to (C) of FIG. 5 and the process that sinters the dielectric layer 104 is sintered are conducted in the same manner as in the first embodiment. Accordingly, the following description focuses on the difference between the first embodiment and the second embodiment.

In the second embodiment, referring to (A) of FIG. 7, applying conductive liquid to the sintered dielectric layer 104 with the discharge head 101 forms a conductive layer 112. The conductive layer 112 corresponds to the copper (Cu) layer 20 in the prerequisite technologies and may be made of nickel (Ni), in addition to copper (Cu). The solder ball 24a serving as the outer electrode 5 is formed on the conductive layer 112, as described in the prerequisite technologies. After the solder ball 24a is formed, the wafer 10 is cut out into individual semiconductor chips 110 by dicing, as described in the prerequisite technologies. The semiconductor device 110 according to the second embodiment is manufactured in the above manner.

Almost the same effects as in the first embodiment are achieved in the second embodiment. Furthermore, since the conductive layer that has been formed by sputtering in the prerequisite technologies can be formed by the inkjet method, the simplified manufacturing process and the reduction in amount of used material and in cost of manufacture can be attained, as in the formation of the dielectric layer 104 by the inkjet method.

Although the formation of the capacitors by forming the dielectric layer by the inkjet method in a single-layer wiring structure has been described in the first and second embodiments, capacitors can be formed in a multilayer wiring structure in the same manner as in the single-layer wiring structure.

Figure 8:
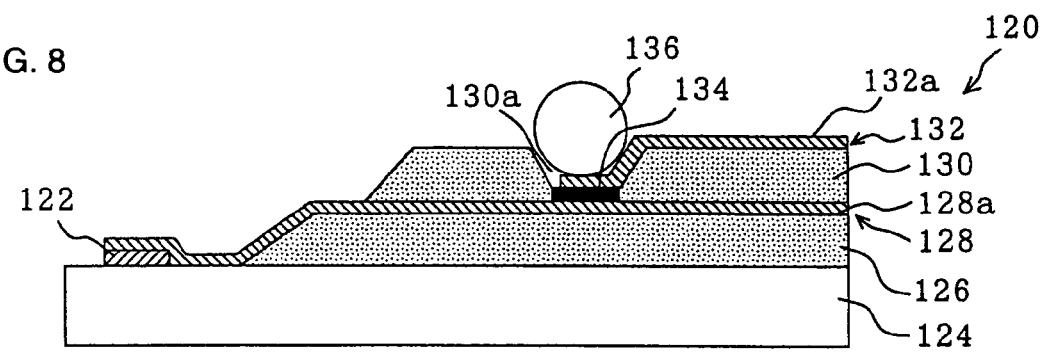
FIG. 8 illustrates a semiconductor device having a capacitor formed in a multilayer wiring structure.
Figure 9A:
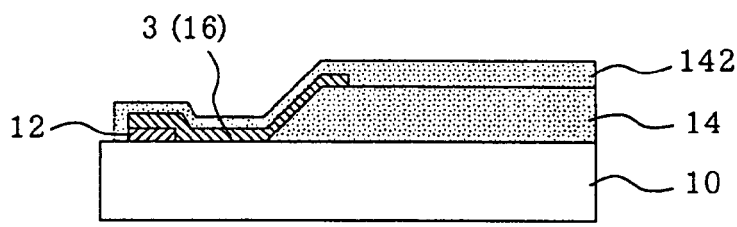
FIG. 9 illustrates a method for manufacturing a semiconductor device according to a third embodiment of the present invention.
Figure 9B:
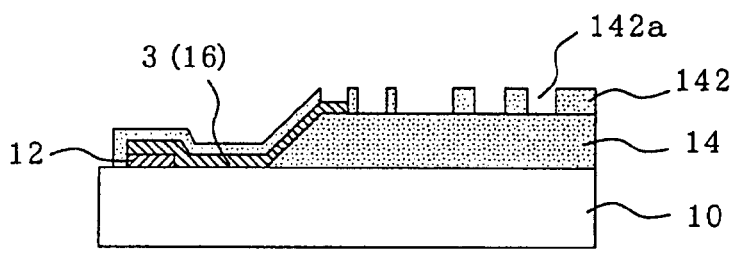
Figure 9C:
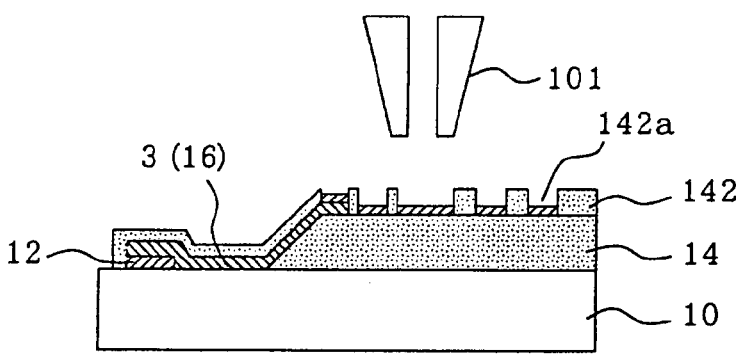
Figure 9D:
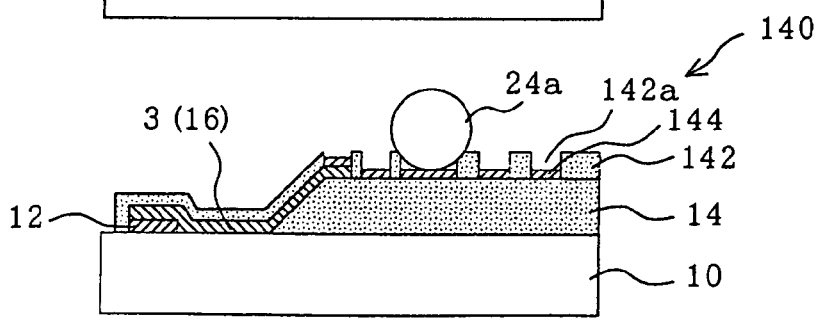

FIG. 8 illustrates a semiconductor device 120 having a capacitor formed in a multilayer wiring structure. In the semiconductor device 120, a first insulating layer (a first stress relief layer) 126, a first wiring layer 128, a second insulating layer (a second stress relief layer) 130, and a second wiring layer 132 are provided on a wafer 124 on which an electrode 122 is formed. A depression 130a is formed in the second insulating layer 130. Part of a first line 128a formed in the first wiring layer 128 is exposed at the bottom of the depression 130a. Dielectric liquid is applied to the exposed part with the discharge head 101 to form a dielectric layer 134. A second line 132a that is formed in the second wiring layer 132 overlays the top surface of the dielectric layer 134, the right side wall of the depression 130a, and the top surface of the second insulating layer 130. A solder ball 136 serving as the outer electrode 5 is formed on the second line 132a that is the top wiring layer over the dielectric layer 134.

The dielectric layer 134 formed between the first line 128a and the second line 132a in the above manner constitutes a capacitor. Here, after the dielectric layer 134 is formed, any of the methods according to the first embodiment and the second embodiment may be used. In effect, a capacitor can be formed in any of the methods according to the first embodiment and the second embodiment even in the multilayer wiring structure, in which insulating layers (stress relief layers) and wiring layers are alternately layered and a wiring layer is electrically connected to the next wiring layer. The multilayer wiring structure is not limited to the two-layered structure shown in FIG. 8 and a multilayer wiring structure having any number of layers is deemed to be within the scope of the embodiments of the present invention.

Third Embodiment

An inductor is formed on a semiconductor device having the CSP structure described in the prerequisite technologies in a third embodiment.

Figure 10:
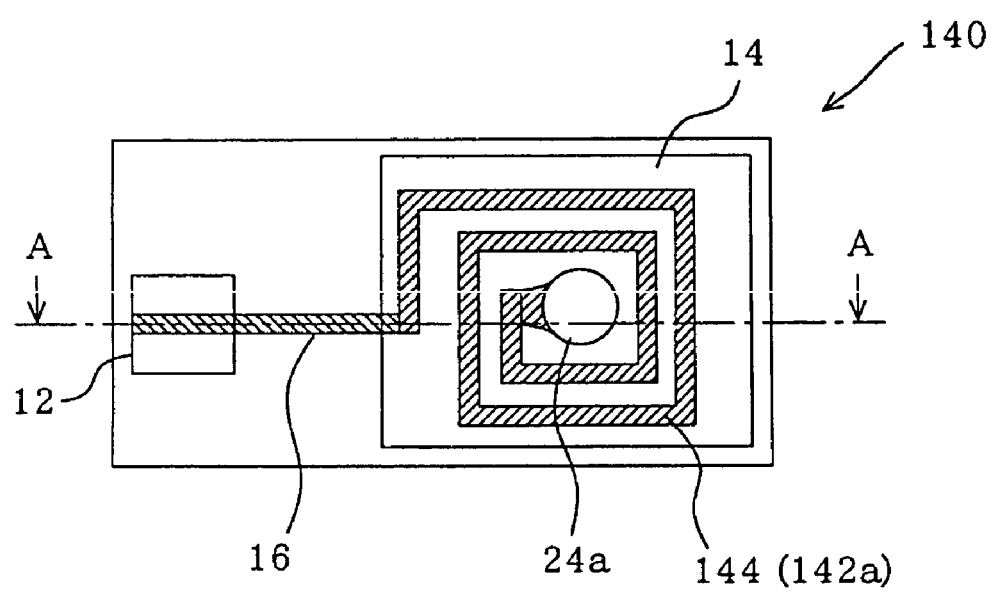
FIG. 10 is a plan view of the semiconductor device manufactured by the method shown in FIGS. 9A to 9D.
Figure 11A:
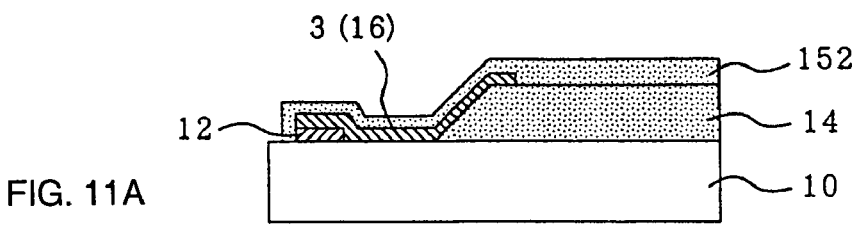
FIG. 11 illustrates a method for manufacturing a semiconductor device according to a fourth embodiment of the present invention.
Figure 11B:
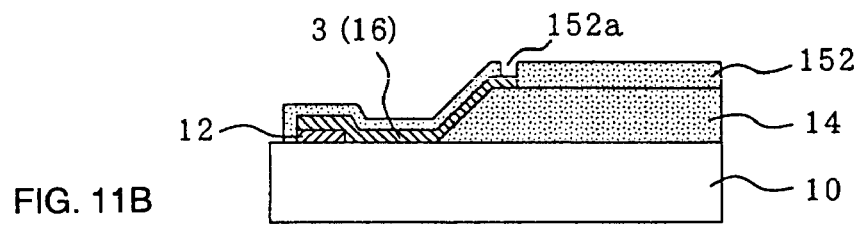
Figure 11C:
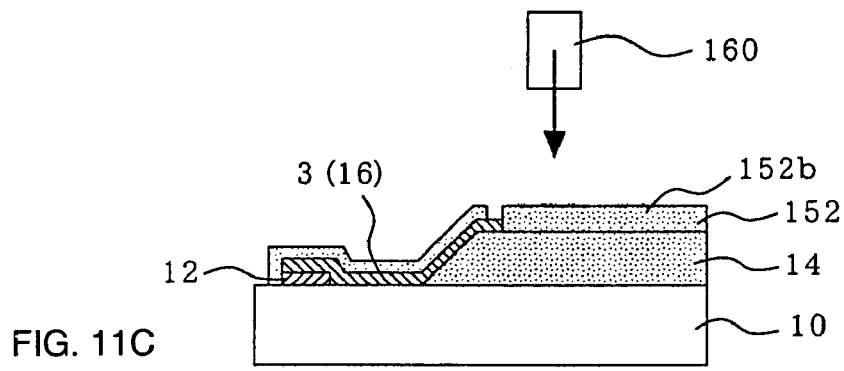
Figure 11D:
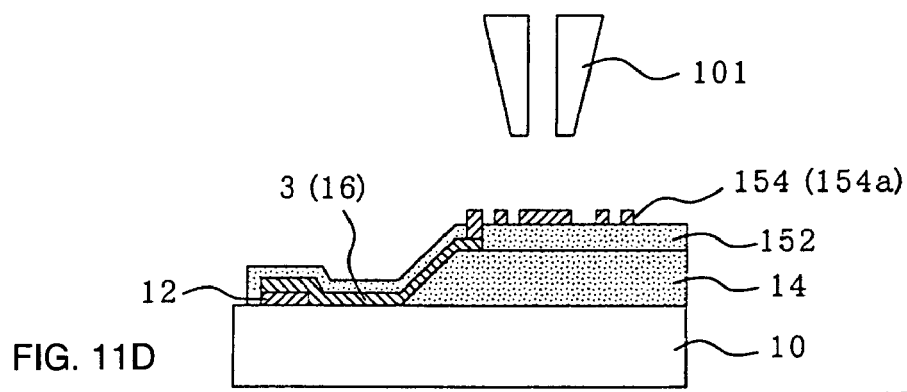
Figure 11E:
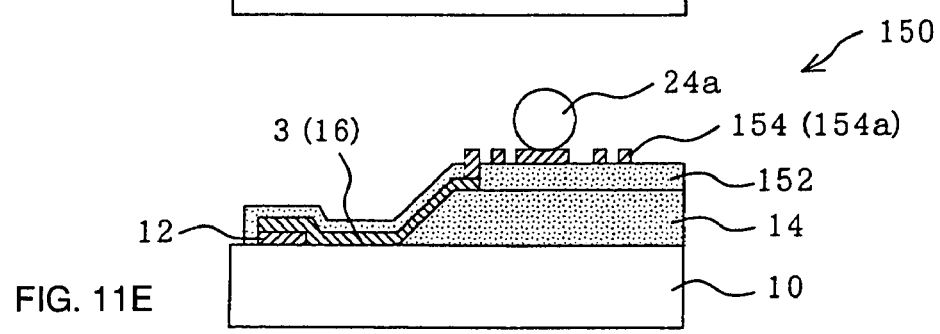

FIG. 9 is a diagram illustrating a method for manufacturing the semiconductor device, according to the third embodiment. FIG. 10 is a plan view of the semiconductor device manufactured by the method shown in FIG. 9. The manufacturing process in FIG. 9 corresponds to the manufacturing process at a cross section taken on line A—A in FIG. 10.

In the third embodiment, the processes shown in (A) to (E) of FIG. 1 and (A) of FIG. 2 are conducted in the same manner as in the prerequisite technologies. Hence, the detailed description of the processes that are the same in the prerequisite technologies will be omitted. The following description focuses on the difference between the third embodiment and the prerequisite technologies in the subsequent processes.

After the lines 3 are formed in the chromium (Cr) layer 16 that is a wiring layer, a layer having a spiral and depressed open pattern 142a is formed on the lines 3. Specifically, referring to (A) of FIG. 9, a second insulating layer 142 made of photosensitive polyimide resin is formed over the wafer 10. The second insulating layer 142 is formed by applying photosensitive polyimide resin to the wafer 10. Referring to (B) of FIG. 9 and FIG. 10, the spiral and depressed open pattern 142a is formed in the second insulating layer 142 by exposure, development, and firing in a photolithography process.

The spiral open pattern 142a is formed such that the outer end thereof is positioned on the end of the line 3 opposite the electrode 12 to expose this end of the line 3 and the inner end thereof is positioned at a place where the solder ball 24a is formed. The spiral open pattern 142a is also formed so as to have a predetermined number of turns and a predetermined line width. Referring to (C) of FIG. 9, conductive liquid is applied to the spiral open pattern 142a with the discharge head 101 to form an inductor 144 that is a spiral conductive layer. The conductive liquid is, for example, conductive material, conductive mixture, or liquid metal. Specifically, mercury, organic solvent containing silver filler, epoxy resin containing silver filler, and so on may be used.

Referring to (D) of FIG. 9, in the same manner as in the prerequisite technologies, the solder ball 24a serving as the outer electrode 5 is formed on the inner end of the inductor 144. After the solder ball 24a is formed, the wafer 10 is cut out into individual semiconductor devices 140 by dicing, as described in the prerequisite technologies. The semiconductor device 140 according to the third embodiment is manufactured in the above manner.

The second insulating layer 142 serves as a protective film for the lines 3 because the second insulating layer 142 is formed on the lines 3 in the third embodiment. In contrast, the inductor 144 is exposed, so that an insulating layer serving as a protective film for the inductor 144 is preferably formed on the inductor 144.

The second insulating layer 142 is formed on the chromium (Cr) layer 16 and the spiral open pattern 142a is formed in the second insulating layer 142 in the third embodiment. In other words, the second insulating layer 142 having the open pattern 142a for storing conductive liquid to be applied in a subsequent process is formed on the chromium (Cr) layer 16. However, directly applying conductive liquid in a spiral pattern by the inkjet method may form the inductor 144 that is electrically connected to the lines 3 on the first insulating layer 14, without the second insulating layer 142 formed.

According to the third embodiment, since the inkjet method is employed for forming the inductor 144, the manufacturing process can be simplified, compared with conventional technologies in which inductors are formed by sputtering, photolithography, and electroplating. In conventional technologies, specifically, an under bump metal (UBM) layer is formed by sputtering, a resist layer is formed on the UBM layer, and a desired spiral open pattern is formed on the resist layer by photolithography. Next, a conductive layer is formed on the spiral open pattern by electroplating to form an inductor. In contrast, in the film formation process by using the inkjet method according to the present invention, controlling the discharge head 101 to apply conductive liquid in a spiral pattern forms the inductor 144. The manufacturing process can be simplified in the film formation process of the present invention, thus improving the productivity and achieving the cost reduction.

Conductive liquid can be applied only to the spiral open pattern 142a in the inkjet method. Compared with a method in which an inductor is formed by sputtering, photolithography, and electroplating, conductive liquid can be applied only to areas that require the application, so that the amount of used material can be reduced, thus achieving the reduction in cost of manufacture in this aspect.

Since the required amount of conductive liquid can be applied by controlling the number of times the conductive liquid is discharged with the discharge head 101 in the inkjet method, the thickness of the conductive layer constituting the inductor 144 can be easily controlled, compared with film formation process by electroplating. Accordingly, the resistance dependent on the thickness can be easily controlled and controlling the thickness allows the inductor 144 having a desired resistance to be easily formed. Furthermore, since the thickness depends on the number of times conductive liquid is discharged with the discharge head 101, very high-precision thickness control can be realized.

Conductive liquid can be applied different number of times to different portions on the wafer 10 in the inkjet method, so that varying the number of times the conducive liquid is discharged for every semiconductor chip can form inductors having different resistances for every semiconductor chip.

Varying the number of turns in the spiral open pattern 142a and controlling the driving of the discharge head 101 in accordance with the varied number of turns to control the number of turns in the spiral open pattern 142a to which conductive liquid is applied allow the inductor 144 having a desired inductance to be formed.

Since conductive liquid is applied to the spiral open pattern 142a, the internal surfaces of the open pattern 142a serve as guides for receiving the conductive liquid in the open pattern 142a. Accordingly, the width of the lines 3 can be determined in accordance with the precision in formation of the open pattern 142a, that is, the precision in formation of resist patterns in a photolithography process, so that the inductor 144 can be formed with a high precision. Although the internal surfaces of the open pattern 142a is formed perpendicular to the bottom of open pattern 142a in FIG. 9, they may tilt outward. In such a case, the applied conductive liquid easily flows into the open pattern 142a and therefore the applied conductive liquid is surely received in the open pattern 142a.

In the inkjet method, providing a plurality of tanks for storing different kinds of conductive liquid in different tanks allows different kinds of conductive liquid to be applied for every semiconductor chip.

Fourth Embodiment

In the fourth embodiment, an inductor is formed on a semiconductor device having the CSP structure by roughening the surface of a layer on which the inductor is formed and applying conductive liquid in a spiral pattern to areas where the surface is roughened by using the inkjet method.

FIG. 11 is a diagram illustrating a method for manufacturing the semiconductor device, according to the fourth embodiment. In the fourth embodiment, the processes shown in (A) to (E) of FIG. 1 and (A) of FIG. 2 are conducted in the same manner as in the prerequisite technologies. Hence, the detailed description of the processes that are the same in the prerequisite technologies will be omitted. The following description focuses on the difference between the fourth embodiment and the prerequisite technologies in the subsequent processes.

After the lines 3 are formed in the chromium (Cr) layer 16 that is a wiring layer, referring to (A) of FIG. 11, a second insulating layer 152 made of photosensitive polyimide resin is formed over the wafer 10. The second insulating layer 152 is formed by applying photosensitive polyimide resin to the wafer 10. Referring to (B) of FIG. 11, an opening 152a is formed in part of the second insulating layer 152, under which the first insulating layer 14 exists, to expose part of the lines 3. Specifically, partially removing the second insulating layer 152 by exposure, development, and firing in a photolithography process at a portion under which the first insulating layer 14 exists forms the opening 152a in the second insulating layer 152 in order to expose the lines 3 at the bottom of the opening 152a.

Referring to (C) of FIG. 11, the surface of the second insulating layer 152 is roughened in a spiral pattern at portions where the lines 3 are exposed and a process for improving the adhesiveness to conductive liquid to be applied in a subsequent process is conducted. Specifically, the surface of the second insulating layer 152 is roughened by physically producing rough areas on the second insulating layer 152 by laser abrasion or sandblasting with a laser head 160. A spiral open pattern 152b where the surface of the second insulating layer 152 is roughened is formed such that the outer end thereof is positioned on the end of the line 3 opposite the electrode 12 and the inner end thereof is positioned at a place where the solder ball 24a is formed. The spiral open pattern 152b is also formed so as to have a predetermined number of turns and a predetermined line width.

Referring to (D) of FIG. 11, conductive liquid is applied to the portions where the surface of the second insulating layer 152 is roughened, that is, to the spiral open pattern 152b with the discharge head 101 to form an inductor 154 that is a spiral conductive layer. Referring to (E) of FIG. 11, the solder ball 24a serving as the outer electrode 5 is formed on the inner end of the inductor 154. After the solder ball 24a is formed, the wafer 10 is cut out into individual semiconductor devices 150 by dicing, as described in the prerequisite technologies. The semiconductor device 150 according to the fourth embodiment is manufactured in the above manner.

The second insulating layer 152 serves as a protective film for the lines 3 because the second insulating layer 152 is formed on the lines 3 in the fourth embodiment. In contrast, the inductor 154 is exposed, so that an insulating layer serving as a protective film for the inductor 154 is preferably formed on the inductor 154. A process of forming a protective film for the inductor 154 will now be described.

Figure 12A:
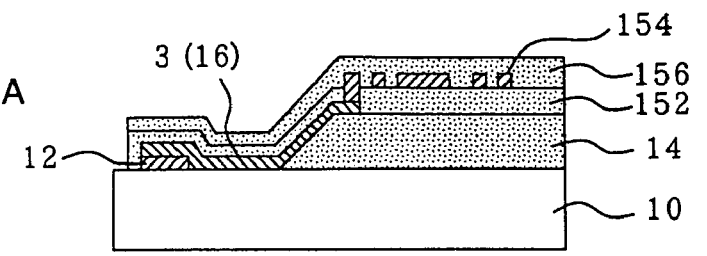
FIG. 12 illustrates a process for forming a protective film for an inductor.
Figure 12B:
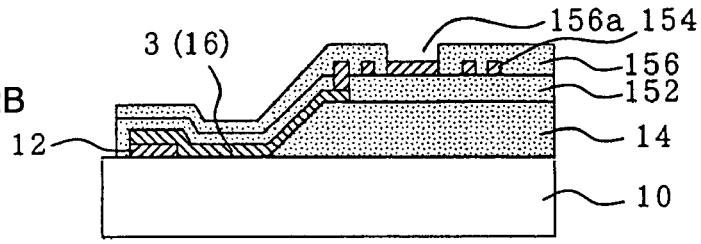
Figure 12C:
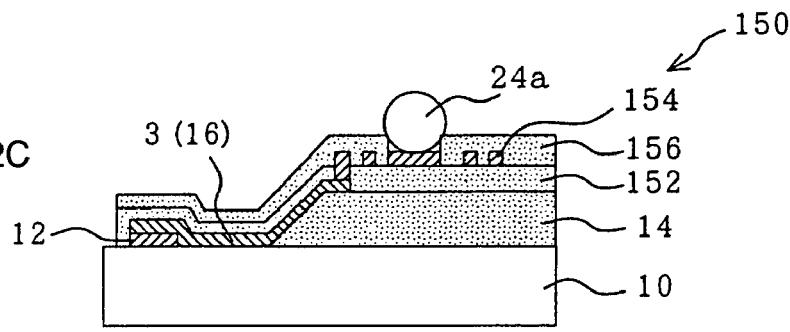

FIGS. 12 is a diagram illustrating the process for forming a protective film for the inductor 154.

After the process shown in (D) of FIG. 11, referring to (A) of FIG. 12, applying, for example, photosensitive polyimide resin to the overall wafer 10 forms a third insulating layer 156. The third insulating layer 156 serves as a protective film. Referring to (B) of FIG. 12, partially removing the third insulating layer 156 by photolithography exposes the inner end of the inductor 154. Referring to (C) of FIG. 12, the solder ball 24a serving as the outer electrode 5 is formed on the exposed portion.

According to the fourth embodiment, the surface of the second insulating layer 152 is roughened in advance at portions where conductive liquid is to be applied, so that the adhesiveness to the conductive liquid is improved, thus achieving the semiconductor device 150 with a higher reliability.

According to the fourth embodiment, the finished semiconductor device 150 has a multilayer wiring structure, in which the chromium (Cr) layer 16 (wiring layer) is formed on the first insulating layer 14 serving as a stress relief layer, the second insulating layer 152 serving as a stress relief layer is formed on the chromium (Cr) layer 16, and a conductive layer (wiring layer) constituting the inductor 154 is formed on the second insulating layer 152, and in which vertically adjacent wiring layers are electrically connected to each other. However, the process of forming an inductor by using the inkjet method according to the present invention is not limitedly applied to the multilayer wiring structure shown in FIG. 12 and may also be applied to a single-layer wiring structure. The number of layers in a multilayer wiring structure is not specifically limited and a multilayer wiring structure having any number of layers is deemed to be within the scope of the embodiments of the present invention.

Fifth Embodiment

A filter having at least one capacitor and at least one inductor in multiple wiring layers that are formed on a semiconductor device having the CSP structure described in the prerequisite technologies is formed in a fifth embodiment. The manufacturing method according to the first embodiment or the second embodiment is used to form a capacitor and the manufacturing method according to the third embodiment or the fourth embodiment is used to form an inductor. The fifth embodiment will now be described in the context of the formation of a low-pass filter.

Figure 13A:
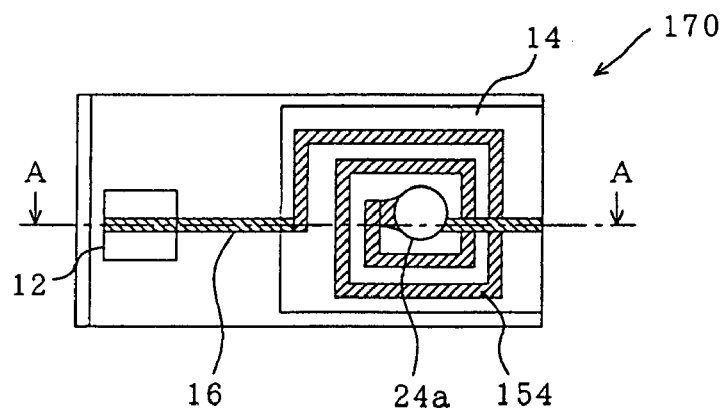
FIG. 13A is a plan view of a semiconductor device of a fifth embodiment of the present invention.
Figure 13B:
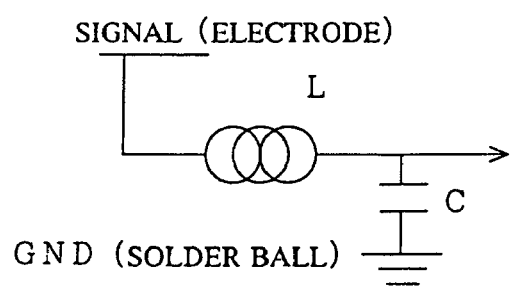
FIG. 13B is a circuit diagram of the semiconductor device in FIG. 13A.
Figure 14A:
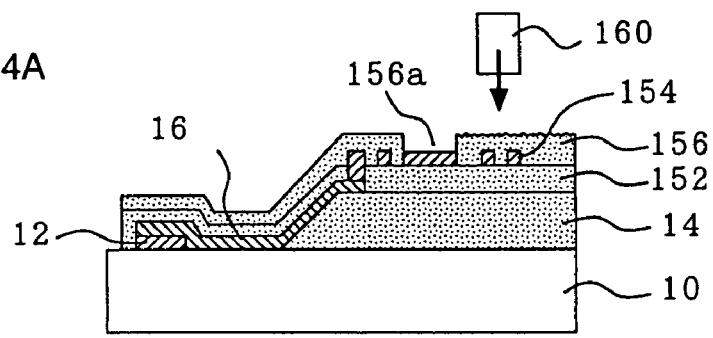
FIG. 14 illustrates a method for manufacturing the semiconductor device shown in FIG. 13A.
Figure 14B:
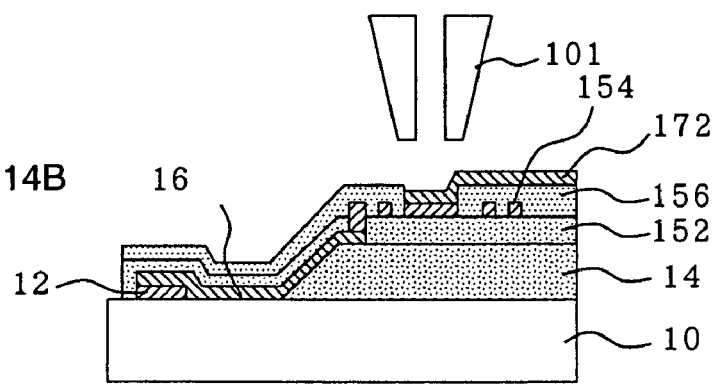
Figure 14C:
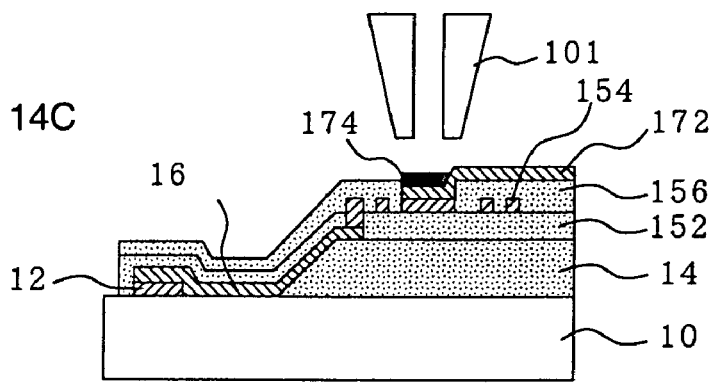
Figure 14D:
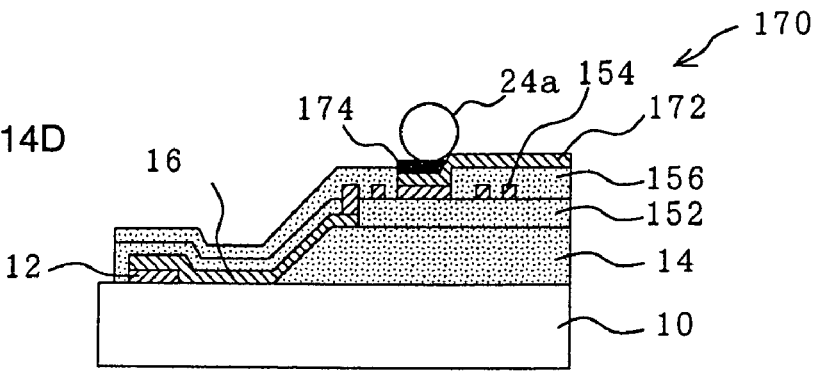

FIGS. 13A and 13B are diagrams illustrating the semiconductor device according to the fifth embodiment. FIG. 13A is a plan view of the semiconductor device of the fifth embodiment. FIG. 13B is a circuit diagram of the semiconductor device. FIG. 14 is a diagram illustrating a method for manufacturing the semiconductor device shown in FIG. 13A. In the fifth embodiment, the processes shown in (A) to (D) of FIG. 11 and the processes shown in (A) and (B) of FIG. 12 are conducted in the same manner as in the fourth embodiment to form an opening 156a in the third insulating layer 156. Accordingly, the detailed description of this process will be omitted and subsequent processes will now be described.

After the opening 156a is formed in the third insulating layer 156, referring to (A) of FIG. 14, part of the top surface of the third insulating layer 156 is roughened and a process for improving the adhesiveness to conductive liquid to be applied in a subsequent process is conducted. Specifically, the surface of the third insulating layer 156 is roughened by physically producing rough areas on the third insulating layer 156 by laser abrasion or sandblasting with the laser head 160.

Referring to (B) of FIG. 14, conductive liquid is applied to the inner end of the inductor 154 and to the portions where the surface of the third insulating layer 156 is roughened with the discharge head 101 to form a wiring layer 172. Referring to (C) of FIG. 14, dielectric liquid is applied to a portion on the wiring layer 172 over the inner end of the inductor 154 with the discharge head 101 to form a dielectric layer 174 and the formed dielectric layer 174 is sintered.

Referring to (D) of FIG. 14, the solder ball 24a serving as the outer electrode 5, as described in the prerequisite technologies, is formed on the sintered dielectric layer 174. Before the solder ball 24a is formed, the conductive layer 112 may be formed on the sintered dielectric layer 174, as in the second embodiment. Grounding the solder ball 24a causes one end of the inductor 154 to be connected to the electrode 12 and the other end of the inductor 154 to be grounded through the dielectric layer 174, thereby forming a low-pass filter as shown in FIG. 13B. Signals supplied from a semiconductor chip are transmitted to the low-pass filter through the electrode 12.

After the solder ball 24a is formed, the wafer 10 is cut out into individual semiconductor devices 170 by dicing, as described in the prerequisite technologies. The semiconductor device 170 according to the fifth embodiment is manufactured in the above manner.

According to the firth embodiment, since the method in which conductive liquid and dielectric liquid are applied by the inkjet method to portions that require the application to form layers is employed for forming a filter having at least one capacitor and at least one inductor, the manufacturing process can be simplified, compared with a case in which a filter is formed with a film-formation technology by sputtering and photolithography. As a result, the improved productivity and the cost reduction can be achieved.

Although the fifth embodiment has been described in the context of forming a low-pass filter, the fifth embodiment is not limitedly embodied by formation of a low-pass filter. In effect, in the formation of a filter in a multilayer wiring structure that is formed on a semiconductor device having the CSP structure, applying dielectric liquid by the inkjet method should form a dielectric layer and applying conductive liquid in a spiral pattern by the inkjet method should form an inductor. The filter has at least one capacitor having the dielectric layer between the wiring layers at portions where vertically adjacent wiring layers are electrically connected to each other or between the top wiring layer and the outer electrode 5 and at least one inductor that is at least one wiring layer formed in a spiral pattern in the multiple wiring layers. The kind of filter that is to be manufactured is not specifically limited.

Sixth Embodiment

A line having a microstrip line structure is formed by applying conductive liquid by the inkjet method in a sixth embodiment.

Figure 15:
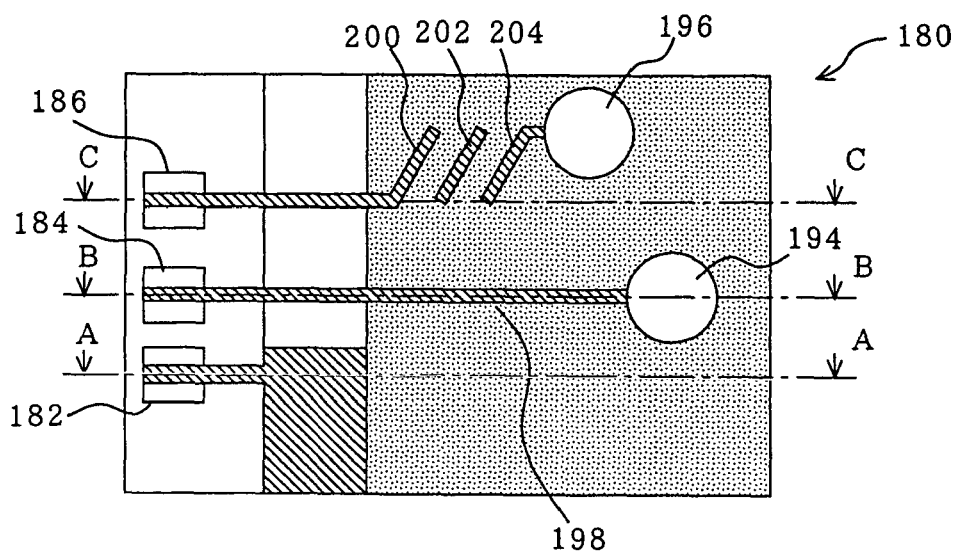
FIG. 15 is a plan view of a semiconductor device according to a sixth embodiment of the present invention.
Figure 16A:
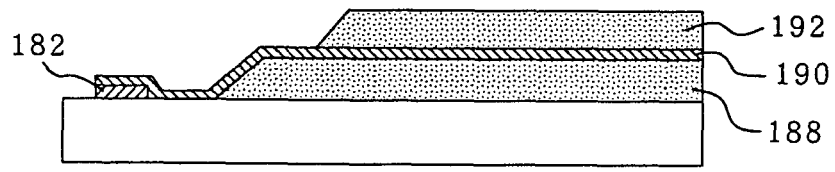
FIGS. 16A to 16C are cross-sectional views of the semiconductor device in FIG. 15.
Figure 16B:
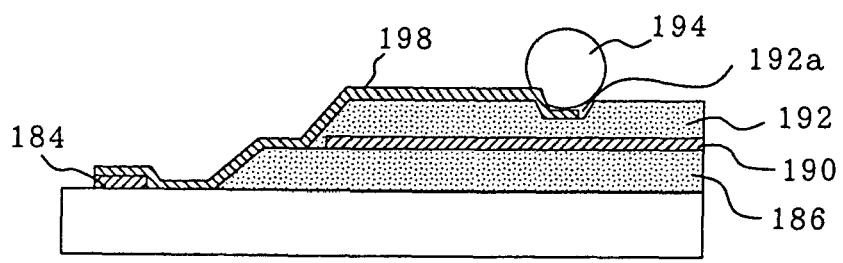
Figure 16C:
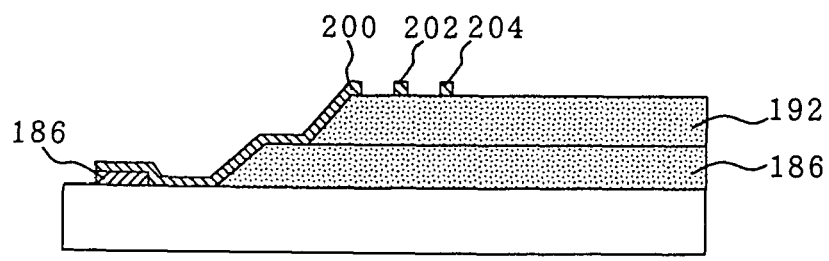

FIG. 15 is a plan view of a semiconductor device 180 of the sixth embodiment. FIG. 16A is a cross-sectional view taken on line A—A in FIG. 15. FIG. 16B is a cross-sectional view taken on line B—B in FIG. 15. FIG. 16C is a cross-sectional view taken on line C—C in FIG. 15.

In the semiconductor device 180 shown in FIGS. 15 and 16A to 16C, a ground 182 having ground potential, a first electrode 184, and a second electrode 186 are formed on the wafer 10. Referring to FIG. 16A, a ground plane 190 is formed on the ground 182 and a first insulating layer 188. A second insulating layer 192 is formed on the ground plane 190.

A first depression 192a (refer to FIG. 16B) on which a first solder ball 194 serving as a first outer electrode is formed and a second depression (not shown) on which a second solder ball 196 serving as a second outer electrode is formed are formed in the second insulating layer 192. A line 198 having a microstrip line structure is formed on an area from the first electrode 184 to the first depression 192a.

Figure 17:
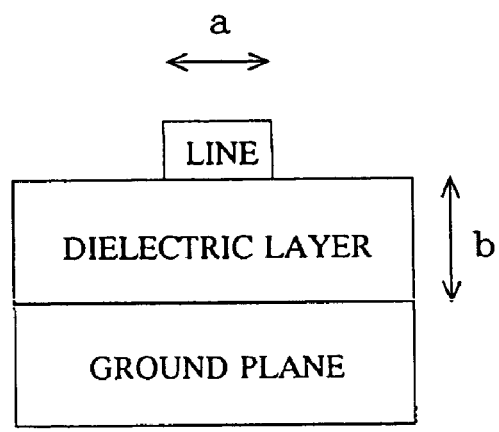
FIG. 17 illustrates a microstrip line structure.

The microstrip line structure means a structure in which a dielectric layer (insulating layer) is provided on a ground plane and a wiring layer is provided on the dielectric layer, as shown in FIG. 17. The microstrip line structure is known as a line structure that can easily control the characteristic impedance of the lines in the wiring layer.

A characteristic impedance $Z_0$ of a line having the microstrip line structure in FIG. 17 is given by the following approximate equation:

$$Z_0 = (\sigma_0)/\in^{1/2}(a/b + 2/\pi(1 + \pi a/2b))) \tag{2}$$

where $\sigma_0$ represents a characteristic impedance in vacuum of 377 Ω, a represents the width of a line (mm), b represents the thickness of an insulating layer (mm), and $\in$ represents the relative dielectric constant of the insulating layer.

The line 198 is a line having the microstrip line structure, which is provided on the second insulating layer 192 that is provided on the ground plane 190, as shown in FIG. 16B. Applying conductive liquid with the discharge head 101 forms the line 198 in the sixth embodiment.

A bandpass filter is formed on the second insulating layer 192 in the microstrip line structure. Namely, a plurality of (three in FIG. 16C) strip lines, that is, a first strip line 200, a second strip line 202, and a third strip line 204 that are electromagnetically coupled to each other are formed so as to be spaced at predetermined intervals. The first strip line 200 extends toward the second electrode 186 to be connected to the second electrode 186. The end of the third strip line 204 opposite the second electrode 186 is positioned in a second depression (not shown). The second solder ball 196 serving as the second outer electrode is formed on the third strip line 204 positioned in the second depression. The first strip line 200, the second strip line 202, and the third strip line 204 are structured so as to be impedance lines through which the wavelength of transmitted signals decreases to about a quarter. These strip lines 200, 202, and 204 are also formed by applying conductive liquid with the discharge head 101.

With this structure, electrical signals supplied from the second electrode 186 are coupled to the second strip line 202 to cause half-wavelength resonance and its electromagnetic energy is coupled to the third strip line 204. Accordingly, the electrical signals are transmitted toward the second solder ball 196, thereby constituting a bandpass filter that transmits electrical signals at a predetermined frequency.

According to the sixth embodiment, applying conductive liquid by using the inkjet method also allows lines having the microstrip line structure to be formed. The use of the inkjet method enables the lines to be manufactured in a decreased number of processes, compared with a case in which similar lines are formed with a thin-film formation technology by sputtering and photolithography. As a result, a bandpass filter including lines having the microstrip line structure can be manufactured in a small number of processes, thus achieving the improved productivity and the reduction in cost.

Figure 18A:
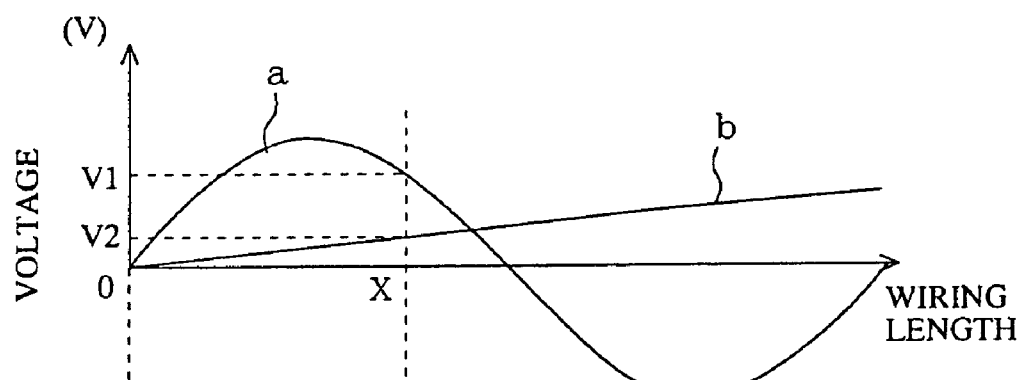
FIG. 18 is a diagram illustrating the relationship between the wiring length and the transmission characteristic in a semiconductor device handling high-frequency signals.
Figure 18B:
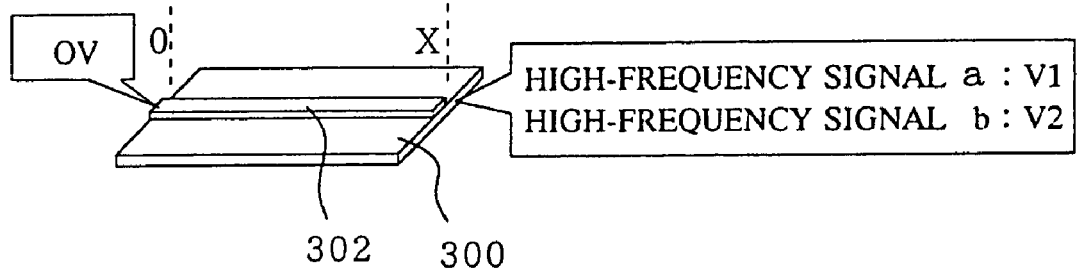

In semiconductor devices handling high-frequency signals, it is necessary to mount passive devices adjacently to semiconductor chips. FIG. 18 is a diagram illustrating this case.

(A) of FIG. 18 is a graph showing some waveforms having different frequencies, where the horizontal axis represents wire length and the vertical axis represents voltage. (B) of FIG. 18 is a diagram showing a line 302 having a wiring length of X cm provided on a substrate 300.

The difference in voltage between the right edge of the line 302 and the left edge thereof in (B) of FIG. 18 is 1V for a high-frequency signal a and is V2(<V1) for a high-frequency signal b, as seen from (A) of FIG. 18. In other words, (B) of FIG. 18 shows that the transmission characteristic is greatly affected by the difference in phase of waveforms owing to the wiring length in the transmission of high-frequency signals. Hence, the wiring length must be smaller as the frequency increases.

According to the embodiments described above, passive devices (capacitors, inductors, and filters) that have been externally attached to a substrate as chips can be formed on a semiconductor device having the CSP structure, thus improving the electrical characteristics and increasing the packaging density.

The manufacturing methods according to the embodiments may be introduced into wafers before dicing or may be introduced into individual semiconductor devices produced by cutting out wafers by dicing, as described above. From the point of production cost, it is preferable that the methods be introduced into wafers before dicing for batch processing. The methods of the present invention have a superior advantage of being capable of forming passive devices (inductors, capacitors, and filters) having different electrical characteristics for every semiconductor chip on wafers before dicing. It seems to be almost impossible, from the point of production cost, for conventional methods by using sputtering and photolithography to form such passive devices on wafers before dicing. In other words, in order to form passive devices having different electrical characteristics for every semiconductor chip in conventional thin-film formation technologies by using sputtering and photolithography, it is necessary to form the passive devices on individual semiconductor chips, after wafers are cut out into individual semiconductor chips, by, for example, varying the thickness of films. Such formation seems to be practically difficult because of low working efficiency, long manufacturing time, and increased cost of manufacture.

The entire disclosure of Japanese Patent Application No. 2003-006613 filed Jan. 15, 2003 is incorporated by reference.

What is claimed is:

1. A method for manufacturing a semiconductor device, the method comprising the steps of:
    forming a stress relief layer on a wafer such that the stress relief layer is away from at least part of electrodes formed on the wafer;
    forming a wiring layer consisting of wiring extending over the stress relief layer;
    forming outer electrodes over predetermined portions of the wiring layer to electrically connect the outer electrodes to the wiring layer over the stress relief layer wherein the method further comprises the step of:
    forming a dielectric layer by applying dielectric liquid by an inkjet method on the predetermined portions after the step of forming the wiring layer, such that the wiring layer, the dielectric layer and the outer electrodes form capacitors above the stress relief layer.

2. A method for manufacturing a semiconductor device according to claim 1, wherein the method further comprises the steps of:
    forming a protective film on the wiring layer, after the step of forming the wiring layer; and
    forming openings in at least part of the protective film, corresponding to the predetermined portions of the wiring layer where the outer electrodes are to be formed,
    and the dielectric liquid is applied to the openings by the inkjet method to form the dielectric layer in the step of forming the dielectric layer.

3. A method for manufacturing a semiconductor device according to claim 1, the method further comprising the step of sintering the dielectric layer after the step of forming the dielectric layer.

4. A method for manufacturing a semiconductor device according to claim 3, the method further comprising the steps of:
    forming a conductive layer by applying conductive liquid by the inkjet method on the sintered dielectric layer, the steps being conducted after the step of sintering the dielectric layer.

5. A method for manufacturing a semiconductor device according to claim 1, wherein, in the step of forming the dielectric layer, the number of times the dielectric liquid is discharged with a discharge head for applying the dielectric liquid by the inkjet method is controlled to control the thickness of the dielectric layer and form the capacitors having a desired capacitance.

6. A method for manufacturing a semiconductor device, the method comprising the steps of:
    forming a stress relief layer on a wafer such that the stress relief layer is away from at least part of electrodes formed on the wafer;
    forming a wiring layer consisting of wiring extending over the stress relief layer;
    forming outer electrodes over predetermined portions of the wiring layer to electrically connect the outer electrodes to the wiring layer over the stress relief layer; and
    forming on the stress relief layer an inductor, which is electrically connected to the wiring layer, by applying conductive liquid in a spiral pattern by an inkjet method, after the step of forming the wiring layer.

7. A method for manufacturing a semiconductor device according to claim 6, the method further comprising the steps of:
    forming a protective film on the wiring layer, after the step of forming the wiring layer; and forming a spiral open pattern corresponding to the inductor in the protective film, before the step of forming the inductor, wherein the conductive liquid is applied to the open pattern by the inkjet method to form the inductor in the step of forming the inductor.

8. A method for manufacturing a semiconductor device according to claim 6, further comprising the step of roughening the surface of the stress relief layer in a spiral pattern before the step of forming the inductor, wherein, in the step of forming the inductor, the conductive liquid is applied to the roughened surface of the stress relief layer by the inkjet method to form the inductor.

9. A method for manufacturing a semiconductor device according to claim 8, wherein the step of roughening the surface of the stress relief layer is conducted by laser abrasion or sandblasting.

10. A method for manufacturing a semiconductor device according to claim 6, wherein, in the step of forming the inductor, the number of times the conductive liquid is discharged with a discharge head for applying the conductive liquid by the inkjet method is controlled to control the thickness of the conductive layer and form the inductor having a desired resistance.

11. A method for manufacturing a semiconductor device according to claim 6, wherein, in the step of forming the inductor, the operation of a discharge head for applying the conductive liquid by the inkjet method is controlled to control the number of turns in the spiral pattern and form the inductor having a desired inductance.

12. A method for manufacturing a semiconductor device, the method comprising the steps of:

forming a stress relief layer on a wafer such that the stress relief layer is away from at least part of electrodes formed on the wafer;

forming a wiring layer consisting of wiring extending over the stress relief layer from the electrodes;

forming outer electrodes over predetermined portions of the wiring layer to electrically connect the outer electrodes to the wiring layer wherein the method further comprises the step of:

forming multiple wiring layers in which stress relief layers and wiring layers are alternately laminated, adjacent wiring layers are electrically connected to each other, wherein the step of forming the multiple wiring layers includes the step of forming a filter having at least one capacitor that has a dielectric layer between the wiring layers at the portions where the adjacent wiring layers are electrically connected to each other or between the top wiring layer and the outer electrodes and at least one inductor that is at least one wiring layer formed in a spiral pattern in the multiple wiring layers, and wherein, in the step of forming the filter, applying dielectric liquid by an inkjet method forms the dielectric layer and applying conductive liquid in the spiral pattern by the inkjet method forms the inductor.

13. A method for manufacturing a semiconductor device, the method comprising the steps of:

forming a stress relief layer on a wafer such that the stress relief layer is away from at least part of electrodes formed on the wafer;

forming a wiring layer consisting of wiring extending over the stress relief layer;

forming outer electrodes over predetermined portions of the wiring layer to electrically connect the outer electrodes to the wiring layer over the stress relief layer; and forming multiple wiring layers in which stress relief layers and wiring layers are alternately laminated, and adjacent wiring layers are electrically connected to each other, wherein, in the step of forming the multiple wiring layers, the wiring layer on one face of the top stress relief layer is formed to be a ground plane such that lines having a microstrip line structure are formed in the wiring layer on the other face of the top stress relief layer, and wherein the step of forming the multiple wiring layers includes the step of forming a plurality of strip lines that are electromagnetically coupled to each other and are spaced at predetermined intervals by applying conductive liquid by an inkjet method to the lines having the microstrip line structure to form a bandpass filter.

14. A semiconductor device manufactured by the methods according to claim 1.

* * * * *